US009893041B2

(12) United States Patent
Pokhriyal et al.

(10) Patent No.: US 9,893,041 B2
(45) Date of Patent: Feb. 13, 2018

(54) METHOD OF FORMING AN ARRAY OF A MULTI-DEVICE UNIT CELL

(71) Applicant: GLO AB, Lund (SE)

(72) Inventors: Anusha Pokhriyal, Sunnyvale, CA (US); Sharon N. Farrens, Boise, ID (US)

(73) Assignee: GLO AB, Lund (SE)

( * ) Notice: Subject to any disclaimer, the term of this patent is extended or adjusted under 35 U.S.C. 154(b) by 0 days.

(21) Appl. No.: 15/485,747

(22) Filed: Apr. 12, 2017

(65) Prior Publication Data

US 2017/0301660 A1 Oct. 19, 2017

Related U.S. Application Data

(60) Provisional application No. 62/322,848, filed on Apr. 15, 2016.

(51) Int. Cl.
*H01L 21/00* (2006.01)
*H01L 25/16* (2006.01)
(Continued)

(52) U.S. Cl.
CPC ........ *H01L 25/167* (2013.01); *H01L 21/6835* (2013.01); *H01L 25/0753* (2013.01);
(Continued)

(58) Field of Classification Search
None
See application file for complete search history.

(56) References Cited

U.S. PATENT DOCUMENTS 6,961,993 B2 * 11/2005 Oohata ............... H04N 9/30
257/66
8,343,848 B2 * 1/2013 Ogihara ............... B41J 2/45
347/130
(Continued)

FOREIGN PATENT DOCUMENTS

DE 102007030129 A1 * 1/2009 ......... H01L 33/0079
EP 2555265 A2 6/2013
(Continued)

OTHER PUBLICATIONS

Pokhriyal, A. et al., "Method of Selectively Transferring LED die to a Backplane Using Height Controlled Bonding Structures," U.S. Appl. No. 15/432,216, filed Feb. 14, 2017, 66 pages.
(Continued)

*Primary Examiner* — David E Graybill
(74) *Attorney, Agent, or Firm* — The Marbury Law Group PLLC

(57) ABSTRACT

Backplane-side bonding structures including a common metal are formed on a backplane. Multiple source coupons are provided such that each source coupon includes a transfer substrate and an array of devices to be transferred. Each array of devices are arranged such that each array includes a unit cell structure including multiple devices of the same type and different types of bonding structures including different metals that provide different eutectic temperatures with the common metal. Different types of devices can be sequentially transferred to the backplane by sequentially applying the supply coupons and selecting devices providing progressively higher eutectic temperatures between respective bonding pads and the backplane-side bonding structures. Previously transferred devices stay on the backplane during subsequent transfer processes,
(Continued)

enabling formation of arrays of different devices on the backplane.

13 Claims, 21 Drawing Sheets

(51) Int. Cl.
    *H01L 25/00*    (2006.01)
    *H01L 33/62*    (2010.01)
    *H01L 25/075*   (2006.01)
    *H01L 21/683*   (2006.01)

(52) U.S. Cl.
    CPC .............. *H01L 25/50* (2013.01); *H01L 33/62* (2013.01); *H01L 2221/68363* (2013.01); *H01L 2221/68368* (2013.01); *H01L 2933/0066* (2013.01)

(56) References Cited

U.S. PATENT DOCUMENTS

| | | | | |
|---|---|---|---|---|
| 2002/0064032 A1* | 5/2002 | Oohata | ................... | H04N 9/30 361/760 |
| 2002/0096994 A1* | 7/2002 | Iwafuchi | ............ | H01L 21/2007 313/495 |
| 2003/0024635 A1 | 2/2003 | Utsunomiya | | |
| 2004/0027314 A1* | 2/2004 | Natori | ...................... | G09F 9/33 345/30 |
| 2006/0258027 A1* | 11/2006 | Ohmae | ................. | H01L 33/007 438/22 |
| 2007/0085093 A1* | 4/2007 | Ohmae | ................... | C30B 23/04 257/89 |
| 2008/0121903 A1* | 5/2008 | Hiramatsu | .......... | H01L 21/0237 257/89 |
| 2009/0278142 A1 | 11/2009 | Watanabe et al. | | |
| 2010/0227421 A1* | 9/2010 | Neff | ........................ | H01L 33/38 438/26 |
| 2013/0143338 A1 | 6/2013 | Stephens, IV et al. | | |
| 2017/0121571 A1* | 5/2017 | Namiki | ................... | H01L 24/29 |
| 2017/0162552 A1* | 6/2017 | Thompson | ............ | H01L 25/167 |

FOREIGN PATENT DOCUMENTS

| | | | | |
|---|---|---|---|---|
| JP | 2006140398 A | * | 6/2006 | |
| KR | 20020027253 A | * | 4/2002 | ............... H04N 9/30 |
| WO | WO2016100657 A2 | | 6/2016 | |
| WO | WO2016100662 A1 | | 6/2016 | |

OTHER PUBLICATIONS

International Search Report and Written Opinion of the International Search Authority for International Patent Application No. PCT/US2017/027125, dated Sep. 21, 2017, 9 pages.

* cited by examiner

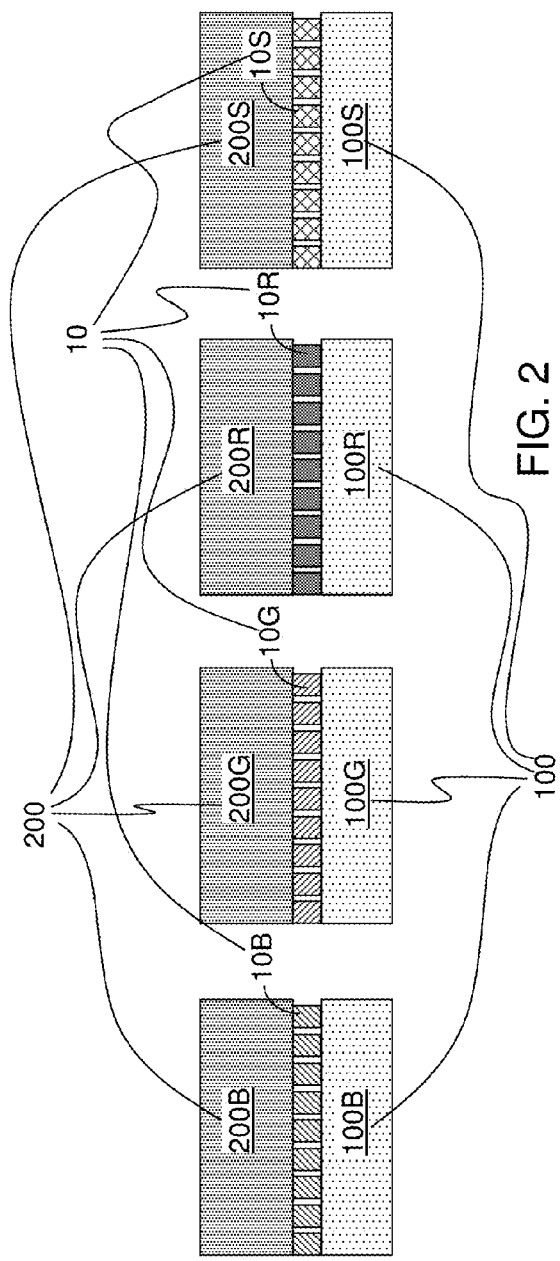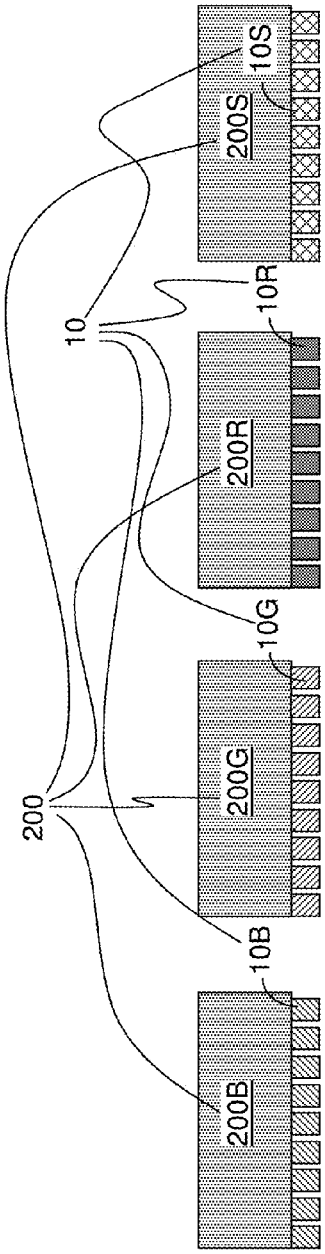

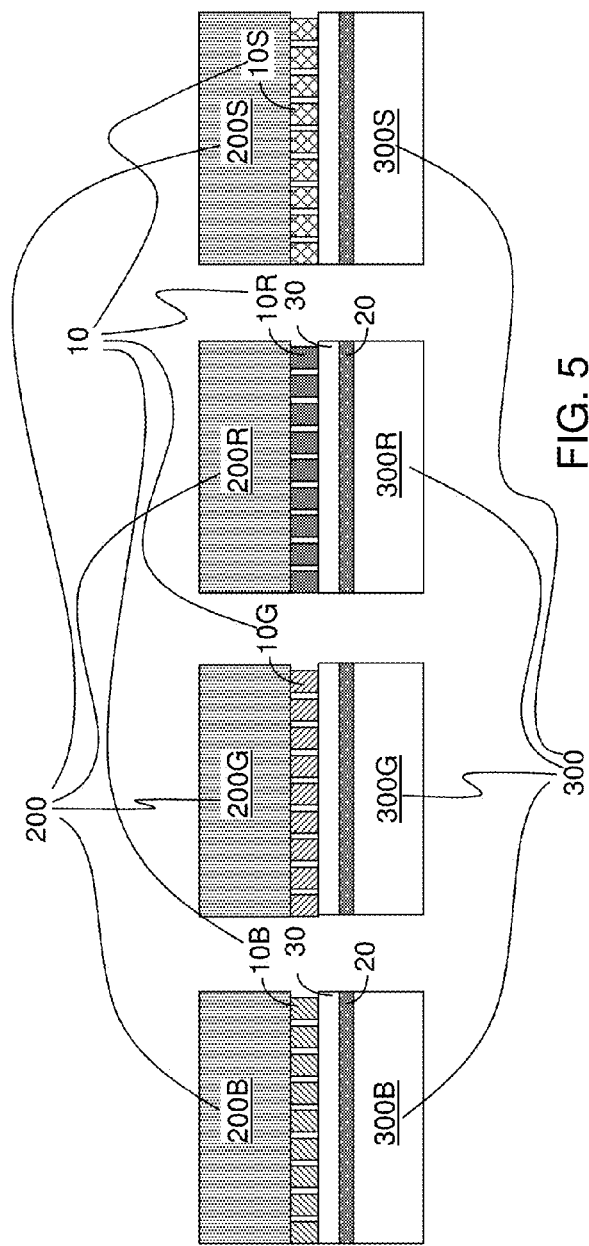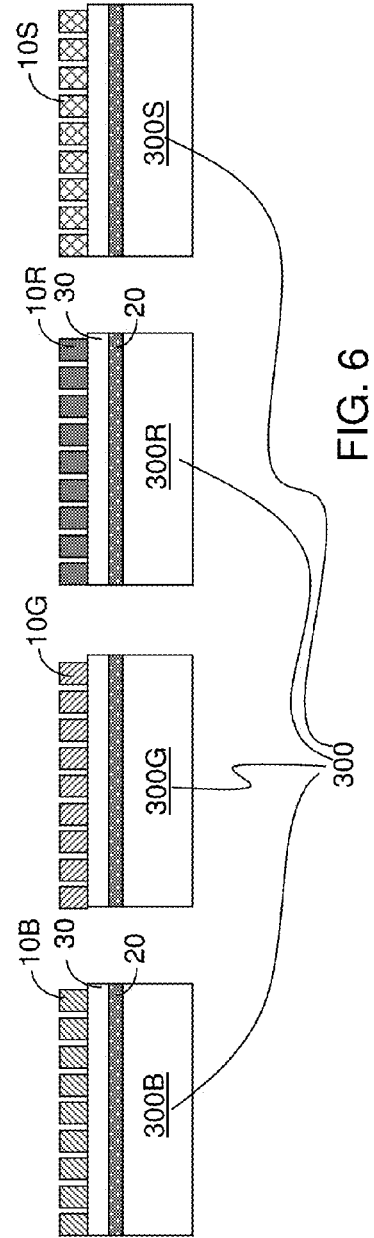

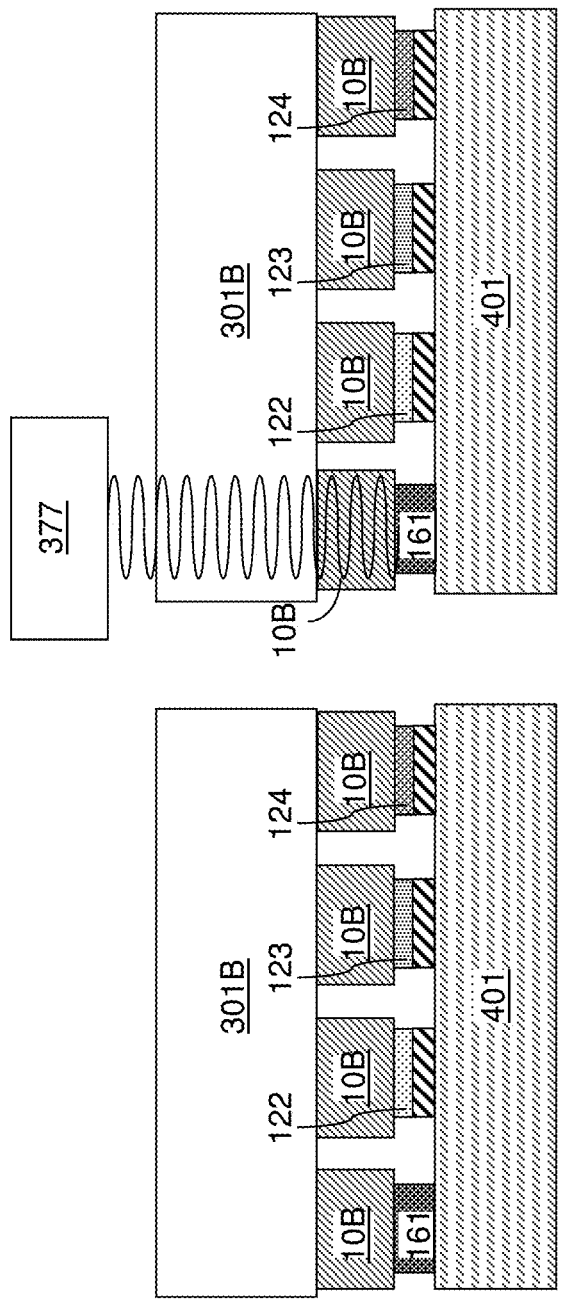

METHOD OF FORMING AN ARRAY OF A MULTI-DEVICE UNIT CELL

FIELD

The embodiments of the invention are directed generally to an array of a multi-device unit cell such as an emissive display panel employing a light emitting device array on a backplane, and a method of manufacturing the same.

BACKGROUND

A device array including semiconductor devices such as light emitting diodes can be employed for various applications. For example, an array of light emitting devices is used in electronic displays, such as direct view display devices.

SUMMARY

According to an aspect of the present disclosure, a method of forming a device assembly is provided. The method of forming a device assembly includes: a step of providing a backplane including a periodic array of multiple instances of a backplane-side unit cell structure that comprises a set of backplane-side bonding structures including a common metal; a step of providing a first source coupon including a first transfer substrate and a periodic array of multiple instances of a first unit cell structure that comprises at least one first device and having a same periodicity as the periodic array of multiple instances of the backplane-side unit cell structure, wherein an instance of a first device-side bonding structure including a first metal is provided on one first device per each first unit cell structure, and the common metal and the first metal are selected to provide a first bonding metallurgy having a first eutectic temperature upon bonding; a step of transferring one first device from each instance of the first unit cell structure to the backplane by bonding respective instances of the first device-side bonding structure to matching backplane-side bonding structures, wherein a periodic array of first bonded material portions having the first bonding metallurgy is formed while backplane-side bonding structures that are not bonded do not reflow; a step of providing a second source coupon including a second transfer substrate and a periodic array of multiple instances of a second unit cell structure that comprises at least one second device and having a same periodicity as the periodic array of multiple instances of the backplane-side unit cell structure, wherein an instance of a second device-side bonding structure including a second metal is provided on one second device per each second unit cell structure, and the common metal and the second metal are selected to provide a second bonding metallurgy having a second eutectic temperature upon bonding, and the second eutectic temperature is greater than the first eutectic temperature; and a step of transferring one second device from each instance of the second unit cell structure to the backplane by bonding respective instances of the second device-side bonding structure to matching backplane-side bonding structures.

According to another aspect of the present disclosure, a device assembly comprising a periodic array of multiple instances of a unit cell structure is provided. Each instance of the unit cell structure comprises: a first device bonded to the backplane through a first bonded material portion employing a first bonding metallurgy; and a second device bonded to the backplane through a second bonded material portion employing a second bonding metallurgy. The first bonding metallurgy and the second bonding metallurgy include a common metal. The first bonding metallurgy includes a first metal that is not present in the second bonding metallurgy. The second bonding metallurgy includes a second metal that is not present in the first bonding metallurgy.

BRIEF DESCRIPTION OF THE DRAWINGS

FIG. 2 is a schematic illustration of the step of bonding of the growth substrates to respective first carrier substrates through the respective devices according to an embodiment of the present disclosure.

FIG. 3 is a schematic illustration of the step of removing the growth substrates according to an embodiment of the present disclosure.

FIG. 5 is a schematic illustration of the step of bonding each pair of a first carrier substrate and a second carrier substrate according to an embodiment of the present disclosure.

FIG. 6 is a schematic illustration of the step in which each first carrier substrate is removed from a bonded structure according to an embodiment of the present disclosure.

FIGS. 8A-8C, 8E-8I, 8K-8O, 8Q-8U, 8W, and 8X are sequential vertical cross-sectional view of a first backplane and source coupons employed to transfer devices to multiple backplanes according to an embodiment of the present disclosure.

FIG. 8D is a vertical cross-sectional view of an alternative structure for the structure of FIG. 8C according to an embodiment of the present disclosure.

DETAILED DESCRIPTION

Figure 1:
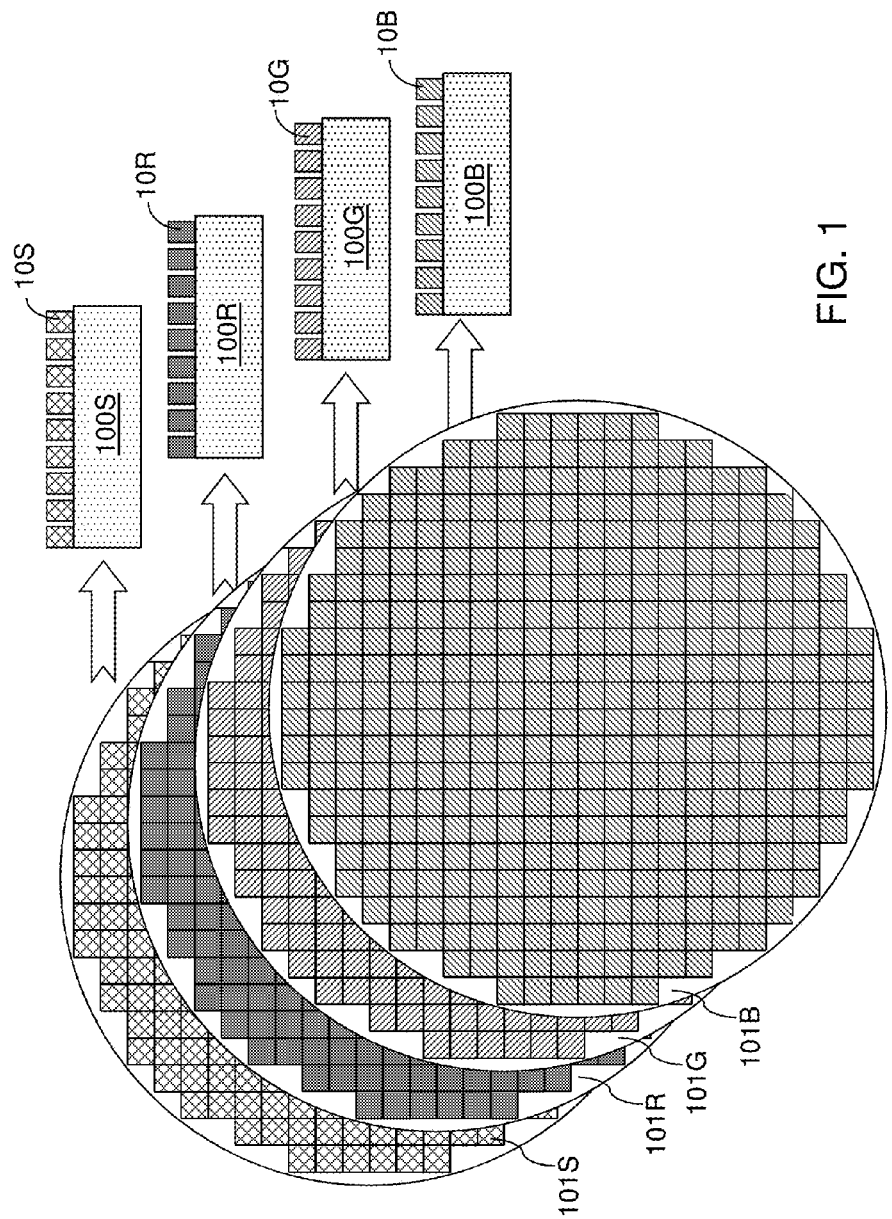
FIG. 1 is a schematic illustration of the step of generation of assemblies of growth substrates with respective devices thereupon from initial growth substrates according to an embodiment of the present disclosure.

As stated above, the present disclosure is directed to an assembly of integrated back light units, and a method of manufacturing the same, the various aspects of which are described below. Throughout the drawings, like elements are described by the same reference numeral. The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure.

As used herein, a "light emitting device" refers to any device that is configured to emit light and includes, but is not limited to, a light emitting diode (LED), a laser, such as a vertical-cavity surface-emitting laser (VCSEL), and any other electronic device that is configured to emit light upon application of a suitable electrical bias. A light emitting device may be a vertical structure (e.g., a vertical LED) in which the p-side and n-side contacts are located on opposite sides of the structure or a lateral structure in which the p-side and n-side contacts are located on the same side of the structure. As used herein, a "light emitting device assembly" refers to an assembly in which at least one light emitting device is structurally fixed with respect to a support structure, which can include, for example, a substrate, a matrix, or any other structure configured to provide stable mechanical support to the at least one light emitting device.

In the present disclosure, a method is provided for transferring an array of devices (such as an array of light emitting devices or an array of sensor devices) from a growth substrate to a target substrate. The target substrate can be any substrate on which formation of multiple types of devices in any configuration is desired. In an illustrative example, the target substrate can be a backplane substrate such as an active or passive matrix backplane substrate for driving light emitting devices. As used herein, a "backplane substrate" refers to any substrate configured to affix multiple devices thereupon. In one embodiment, the center-to-center spacing of neighboring light emitting devices on the backplane substrate can be an integer multiple of the center-to-center spacing of neighboring light emitting devices on the growth substrate. The light emitting devices may include a plurality of light emitting devices, such as a group of two light emitting devices, one configured to emit blue light and one configured to emit green light. The light emitting devices may include a group of three light emitting devices, one configured to emit blue light, one configured to emit green light, and one configured to emit red light. As used herein, "neighboring light emitting devices" refer to a plurality of two or more light emitting devices located in closer proximity than at least another light emitting device. The method of the present disclosure can provide selective transfer of a subset of light emitting devices from a light emitting device array on a growth substrate to the backplane substrate.

Referring to FIG. 1, devices (10B, 10G, 10R, 10S) can be fabricated on respective initial growth substrates (101B, 101G, 101R, 101S) employing methods known in the art. As used herein, an "initial growth substrate" refers to a substrate that is processed to form devices thereupon or therein. The devices (10B, 10G, 10R, 10S) can include light emitting devices (10B, 10G, 10R) and/or sensor devices 10S (e.g., photodetectors) and/or any other electronic devices. The light emitting devices (10B, 10G, 10R) can be any type of light emitting devices, i.e., vertical light emitting devices, lateral light emitting devices, or any combination thereof. Devices of the same type can be formed on each initial growth substrate (101B, 101G, 101R, 101S). The devices (10B, 10G, 10R, 10S) can be formed as an array on the respective initial growth substrates (101B, 101G, 101R, 101S).

In one embodiment, the initial growth substrates (101B, 101G, 101R, 101S) can include an absorbing substrate such as a silicon substrate. As used herein, an "absorbing substrate" refers to a substrate that absorbs more than 50% of light energy within the spectrum range including ultraviolet range, visible range, and infrared range. As used herein, "ultraviolet range" refers to the wavelength range from 10 nm to 400 nm; "visible range" refers to the wavelength range from 400 nm to 800 nm, and "infrared range" refers to the wavelength range from 800 nm to 1 mm.

If the initial growth substrates (101B, 101G, 101R, 101S) are absorbing substrates, each array of devices (10B, 10G, 10R, 10S) can be transferred to a respective transparent carrier substrates, or a "transparent substrate," by full wafer transfer processes in which each array of devices (10B, 10G, 10R, 10S) is transferred to the respective transparent substrate in its entirety. As used herein, a "transparent substrate" refers to a substrate that transmits more than 50% of light energy at a wavelength within the spectrum range including ultraviolet range, visible range, and infrared range.

In one embodiment, devices (10B, 10G, 10R, 10S) can include light emitting devices (10B, 10G, 10R). In one embodiment, each light emitting device (10B, 10G, 10R) can be configured to emit light of a single peak wavelength. It is understood that light emitting devices typically emit light of a narrow wavelength band centered around the single wavelength at which the intensity of light is at a maximum, and the wavelength of a light emitting device refers to the peak wavelength. For example, an array of first light emitting devices 10B can be formed on a first-type growth substrate 100B, an array of second light emitting devices 10G can be formed on a second-type growth substrate 100G, and an array of third light emitting devices 10R can be formed on a third-type growth substrate 100R. In addition, an array of sensor devices 10S can be formed on a fourth-type growth substrate 100S. Alternatively, one or more types of light emitting devices (10B, 10G, 10R) can be integrated light emitting devices that are configured to emit light of at least two different wavelengths. In one embodiment, the light emitting devices (10B, 10G, 10R) may comprise arrays of nanowires or other nanostructures.

Contact structures (not explicitly shown) such as contact pads are provided on each light emitting device (10B, 10G, 10R). The contact structures for each light emitting device (10B, 10G, 10R) can include an anode contact structure and a cathode contact structure. In case one or more of the light emitting devices (10B, 10G, 10R) is an integrated light emitting device configured to emit light of at least two different wavelengths, a common contact structure (such as a common cathode contact structure) can be employed. For example, a triplet of blue, green, and red light emitting devices embodied as a single integrated light emitting device may have a single cathode contact.

The array of light emitting devices (10B, 10G, 10R) on each initial growth substrate (101B, 101G, 101R) is configured such that the center-to-center spacing of light emitting devices on a backplane substrate to which the light emitting devices are subsequently transferred is an integer multiple of the center-to-center spacing of light emitting devices (10B, 10G, 10R) on the initial growth substrate (101B, 101G, 101R).

Each initial growth substrate (101B, 101G, 101R, 101S) and devices (10B, 10G, 10R, 10S) thereupon can be diced into suitable sizes. Each diced portion of the initial growth substrate (101B, 101G, 101R, 101S) is herein referred to as a growth substrate (100B, 100G, 100R, 100S). Assemblies of growth substrates (100B, 100G, 100R, 100S) with respective devices (10B, 10G, 10R, 10S) thereupon are thus generated. In other words, the growth substrates (100B, 100G, 100R, 100S) are either the entirety or the diced portions of the initial growth substrates (101B, 101G, 101R, 101S), and an array of devices (10B, 10G, 10R, 10S) is present on each growth substrate (100B, 100G, 100R, 100S). The array of devices (10B, 10G, 10R, 10S) on each growth substrate (100B, 100G, 100R, 100S) can be an array of devices of the same type.

Prior to, or after, each initial growth substrate (101B, 101G, 101R, 101S) is singulated to corresponding growth substrates (100B, 100G, 100R, 100S), each device (10B, 10G, 10R, 10S), e.g., a light emitting device, a group of light emitting devices, or a sensor device, can be mechanically isolated from one another by forming trenches between each neighboring pair of the devices. In an illustrative example, if a light emitting device array or a sensor array is disposed on an initial growth substrate (101B, 101G, 101R, 101S), the trenches can extend from the final growth surface of the light emitting device array or the sensor array to the top surface of the initial growth substrate (101B, 101G, 101R, 101S).

Various schemes may be employed to transfer each array of devices (10B, 10G, 10R, 10S) to a respective transparent substrate, which is herein referred to as a transfer substrate. FIGS. 2-6 illustrate an exemplary scheme that can be employed to transfer each array of devices (10B, 10G, 10R, 10S) to a respective transparent substrate.

Referring to FIG. 2, first carrier substrates 200 can be optionally employed in case the contact structures on each device (10B, 10G, 10R, 10S) are formed on the top side of each device (10B, 10G, 10R, 10S) during fabrication of the devices (10B, 10G, 10R, 10S) on the growth substrates (101B, 101G, 101R, 101S). The first carrier substrates 200 can be any suitable substrate that can be bonded to the devices (10B, 10G, 10R, 10S) and can provide structural support to the (10B, 10G, 10R, 10S). Each as-grown array of devices (10B, 10G, 10R, 10S) and a respective growth substrate 100 is bonded to a first carrier substrate 200. Thus, each growth substrate 100 can be bonded to a respective first carrier substrate 200 through the respective devices 10. In other words, the devices 10 are present between a growth substrate 100 and a first carrier substrate within each bonded structure (100, 10, 200). In an illustrative example, a first-type growth substrate 100B can be bonded to a first-type first carrier substrate 200B through first light emitting devices 10B, a second-type growth substrate 100G can be bonded to a second-type first carrier substrate 200G through second light emitting devices 10G, a third-type growth substrate 100R can be bonded to a third-type first carrier substrate 200R through third light emitting devices 10R, and a fourth-type growth substrate 100S can be bonded to a fourth-type first carrier substrate 200S through the sensor devices 10S.

Referring to FIG. 3, each growth substrate 100 can be removed from the transient bonded structure including the stack of the growth substrate 100, an array of devices 10, and the first carrier substrate 200. For example, if the growth substrate 100 is a silicon substrate, the growth substrate 100 can be removed by a wet chemical etch process, grinding, polishing, splitting (for example, at a hydrogen implanted layer), or a combination thereof. For example, splitting of a substrate can be performed by implanting atoms that form a weak region (such as hydrogen atoms implanted into a semiconductor material) and by applying a suitable processing conditions (for example, an anneal at an elevated temperature and/or mechanical force) to cause the substrate to split into two parts.

Figure 4:
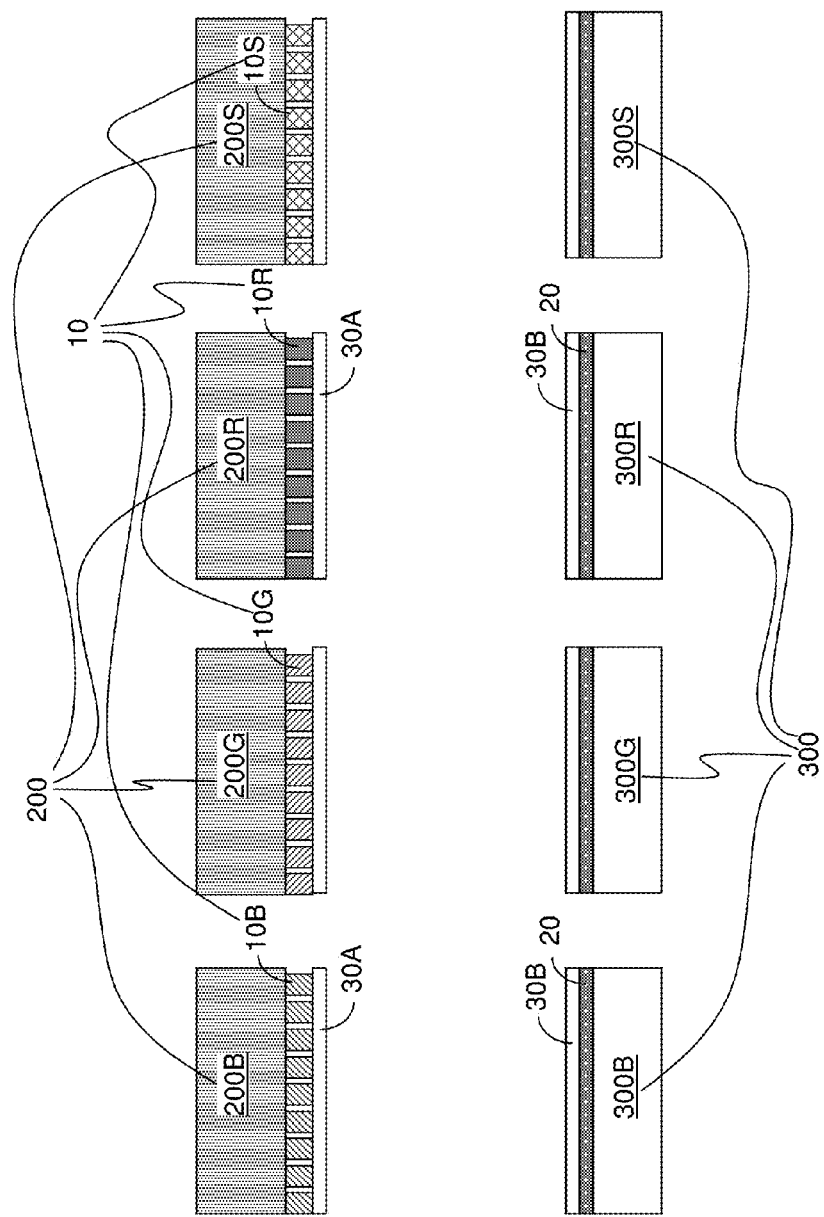
FIG. 4 is a schematic illustration of the step of forming a first bonding material layer on the first carrier substrates, providing second carrier substrate, and forming a release layer and a second bonding material layer according to an embodiment of the present disclosure.

Referring to FIG. 4, a first bonding material layer 30A can be formed on each first carrier substrate 200. The first bonding material layer 30A includes any bonding material that can be bonded to another bonding material upon suitable treatment (such as application of heat and/or pressure). In one embodiment, the first bonding material layer 30A can comprise a dielectric material such as silicon oxide, borophosphosilicate glass (BPSG), a spin-on glass (SOG) material, and/or an adhesive bonding material such as SU-8 or benzocyclobutene (BCB). The thickness of the first bonding material layer 30A can be in a range from 50 nm to 5 micron, although lesser and greater thicknesses can also be employed. In one embodiment, the first bonding material layer 30A can be a silicon oxide layer having a thickness of about 1 micron. The first bonding material layer 30A can be formed by a suitable deposition method such as chemical vapor deposition or spin coating.

Transfer substrates 300 are provided. As used herein, a "transfer substrate" refers to a substrate from which at least one device is transferred to a target substrate, which can comprise a backplane substrate. In one embodiment, each transfer substrate 300 can be a second carrier substrate, which can be employed to receive an array of devices from a respective first carrier substrate 200 and to carry the array of devices until a subset of the devices are transferred to the target substrate in a subsequent process.

In some embodiments, the transfer substrates 300 can be optically transparent at a laser wavelength. The laser wavelength is the wavelength of the laser beam to be subsequently employed to transfer devices individually and selectively from a respective transfer substrate 300 to the target substrate, and can be an ultraviolet wavelength, a visible wavelength, or an infrared wavelength. In one embodiment, the transparent substrates 300 can include sapphire, glass (silicon oxide), or other optically transparent material known in the art. In an alternative embodiment, the transfer substrates 300 can be transparent growth substrates or diced portions thereof. In some other embodiments in which initial growth substrates are cleaved (for example, at a layer implanted with hydrogen or noble gas) to provide a thin substrate from which light emitting diodes are transferred to a backplane without use of transfer substrates, the initial growth substrates may absorb laser at the laser wavelength.

A release layer 20 and a second bonding material layer 30B can be sequentially deposited on each transfer substrate 300. The release layer 20 includes a material that can provide sufficient adhesion to the transfer substrate 300 and is absorptive at the laser wavelength of the laser beam to be subsequently employed during a subsequent selective transfer process. For example, the release layer 20 can include silicon-rich silicon nitride or a semiconductor layer, such as a GaN layer that can be heated by laser irradiation. The thickness of the release layer 20 can be in a range from 100 nm to 1 micron, although lesser and greater thicknesses can also be employed.

The second bonding material layer 30B can comprise a dielectric material such as silicon oxide. The thickness of the second bonding material layer 30B can be in a range from 50 nm to 5 micron, although lesser and greater thicknesses can also be employed. In one embodiment, the second bonding material layer 30B can be a silicon oxide layer having a thickness of about 1 micron. The second bonding material layer 30B can be formed by a suitable deposition method such as chemical vapor deposition or spin coating.

A transfer substrate 300 can be provided for each first carrier substrate 200. For example, a first transfer substrate 300B can be provided for the first-type first carrier substrate 200B; a second transfer substrate 300G can be provided for the second-type first carrier substrate 200G; a third transfer substrate 300R can be provided for the third-type first carrier substrate 200R; and an additional transfer substrate 300S can be provided for the additional type first carrier substrate 300S. Multiple stacked structures can be formed, which include a first stacked structure (300B, 20, 30B) including a stack of the first transfer substrate 300B, a release layer 20, and a second bonding material layer 30B; a second stacked structure (300G, 20, 30B) including a stack of the second transfer substrate 300G, a release layer 20, and a second bonding material layer 30B; a third stacked structure (300R, 20, 30B) including a stack of the third transfer substrate 300R, a release layer 20, and a second bonding material layer 30B; and an additional stacked structure (300S, 20, 30B) including a stack of the additional transfer substrate 300S, a release layer 20, and a second bonding material layer 30B.

The combination of the array of first light emitting devices 10B and the first transfer substrate 300B is herein referred to as a first transfer assembly (300B, 10B), the combination of the second light emitting devices 10G and the second transfer substrate 300G is herein referred to as a second transfer assembly (300G, 10G), and the combination of the third light emitting devices 10R and the third transfer substrate 300R is herein referred to as a third transfer assembly (300R, 10R). In addition, the combination of the sensor devices 10S and the fourth transfer substrate 300S is herein referred to as fourth transfer assembly (300S, 10S).

Referring to FIG. 5, each pair of a first carrier substrate 200 and a transfer substrate 300 (which can be a second carrier substrate) can be bonded. For example, the second bonding material layer 30B can be bonded with the respective first bonding material layer 30A on the corresponding first carrier substrate 200 to form a bonding material layer 30. Each bonded assembly comprises a first transfer substrate 300, a release layer 20, a bonding material layer 30, and an array of devices 10.

Referring to FIG. 6, a first carrier substrate 200 is removed from each bonded assembly (300, 20, 30, 200), for example, by polishing, grinding, cleaving, and/or chemical etching. Each array of devices 20 can be disposed on a transfer substrate 300, which is a transparent carrier substrate with a release layer 20 thereupon, i.e., between the transparent carrier substrate and the array of devices 20.

Referring to FIG. 7, each array of devices 10 on a respective transfer substrate 300 can be arranged such that each device 10 is laterally spaced from neighboring devices 10 by trenches. For example, the array of first light emitting devices 10B on the first transfer substrate 300B can be laterally spaced from one another by trenches. Optionally, a first optical protection material layer 17B can be applied to fill the gaps among the first light emitting devices 10B. Similarly, an optical protection material layer can be applied to fill the gaps among each array of devices 10 on other transfer substrates (300G, 300R, 300S). Each optical protection material layer comprises a material that absorbs or scatters light at the laser wavelength of the laser beam to be subsequently employed. Each optical protection material layer can include, for example, silicon-rich silicon nitride, an organic or inorganic antireflective coating (ARC) material, or a photoresist material. Each optical protection material layer can be formed such that the outside surfaces of the devices 10 are not covered by the optical protection material layer. The optical protection material layers can be formed, for example, by spin coating or by a combination of deposition and a recess etch.

Each assembly (300, 20, 30, 10) comprising a transfer substrate 300 and an array of devices 10 can further comprise a release layer 20 contacting the respective transfer substrate 300 and comprising a material that absorbs light at a wavelength selected from ultraviolet range, visible range, and infrared range, and a bonding material layer 30 contacting the release layer 20 and the respective array of devices 10.

FIGS. 7A-7E illustrate sequential schematic top-down views of multiple supply coupons and multiple backplanes during an exemplary transfer sequence for transferring four different types of devices (10B, 10G, 10R, 10S) (e.g., blue, green and red emitting LEDs and sensors, respectively) to four backplanes (401, 402, 403, 404). FIGS. 8A-8X illustrate vertical cross-sectional views of a first backplane and various structures disposed thereupon.

Figure 7A:
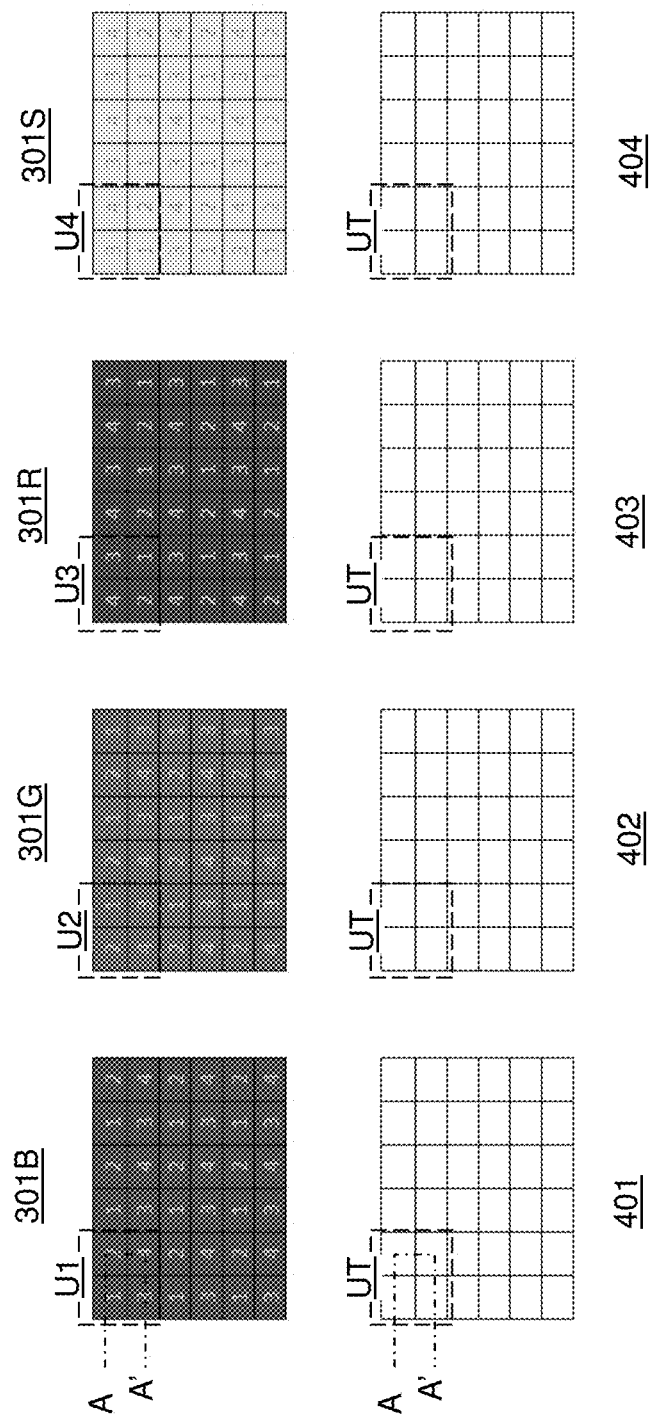
FIGS. 7A-7E are sequential schematic top-down views of supply coupons and backplanes during various steps of a transfer sequence according to an embodiment of the present disclosure.
Figures 8A, 8B:
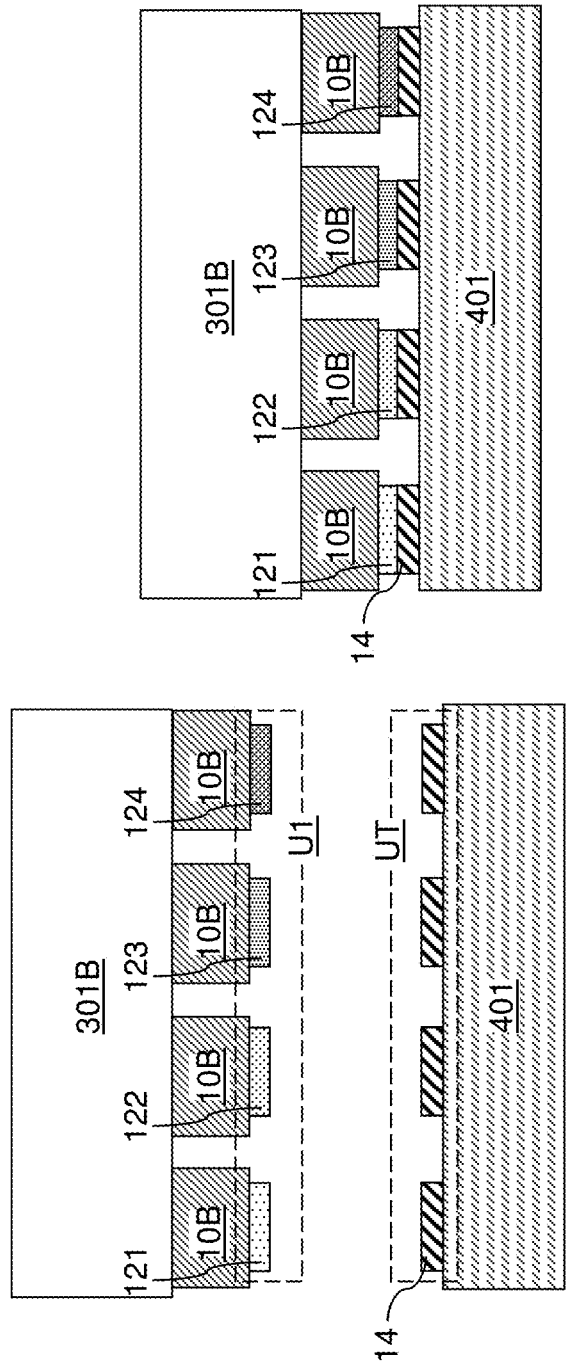
Figure 8F:
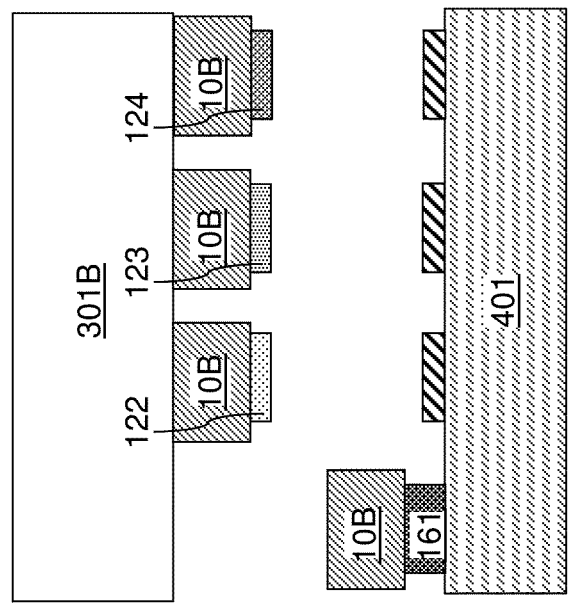

Referring to FIG. 7A, exemplary device-side bonding structure patterns for a set of source coupons and bonding sites on corresponding backplanes (401, 402, 403, 404) are illustrated. The four different types of devices (10B, 10G, 10R, 10S) can be provided on four source substrates (301B, 301G, 301R, 301S), which can comprise four transfer substrates (301B, 301G, 301R, 301S), or four growth substrates (100B, 100G, 100R, 100S), or combinations thereof. First devices 10B of a first type can be provided on the first source 301B, second devices 10G of a second type can be provided on the second source 301G, third devices 10R of a third type can be provided on the third source 301R, and fourth devices 10S of a fourth type can be provided on the fourth source 301S. In one embodiment, the first devices 10B can be light emitting devices that emit light at a first wavelength (i.e., a light spectrum having an intensity peak at the first wavelength), the second devices 10G can be light emitting devices that emit light at a second wavelength, the third devices 10R can be light emitting devices that emit light at a third wavelength, and the fourth devices 10S can be semiconductor sensor devices.

The source substrates (301B, 301G, 301R, 301S) can be aligned to the backplanes (401, 402, 403, 404) prior to transfer of the various subset of devices (10B, 10G, 10R, 10S). FIG. 8A illustrates a vertical cross-sectional view of through the first backplane 401 and the first source substrate 301B after alignment. The zig-zag plane of the vertical cross-sectional view of FIG. 8A are shown in FIG. 7A. The vertical cross-sectional view of the first backplane 401 is illustrative of the second, third, and fourth backplanes (402, 403, 404). In other words, processes performed on the second, third, and fourth backplanes (402, 403, 404) can be substantively equivalent to the processes performed on the first backplane mutatis mutandis in a manner consistent with the configuration illustrated in FIG. 7A.

Each of the backplanes (401, 402, 403, 404) (such as the first backplane 401) includes a periodic array of multiple instances of a backplane-side unit cell structure U that comprises a set of backplane-side bonding structures 14 including a common metal. The common metal is an elemental metal that provides multiple eutectic systems with different metals.

Different types of device-side bonding structures (121, 122, 123, 124) can be formed on the entirety of the devices on each source substrate (301B, 301G, 301R, or 301S). The number of types of device-side bonding structures (121, 122, 123, 124) can be the same as the number of backplanes (401, 402, 403, 404) that are employed for transfer of the devices (10B, 10G, 10R, 10S). In one embodiment, a two-dimensional array of instances of a first unit cell structure U1 can be provided on surfaces of the first devices 10B that are distal from the first source substrate 301. The first unit cell structure U1 can include an instance of a first device-side bonding structure 121, an instance of a second device-side bonding structure 122, an instance of a third device-side bonding structure 123, and an instance of a fourth device-side bonding structure 124.

Instances of the first unit cell structure U1 are repeated on the first source substrate 301B to form a two-dimensional array having a two-dimensional periodicity. Instances of the second unit cell structure U2 are repeated on the second source substrate 301G to form a two-dimensional array having the two-dimensional periodicity. Instances of the third unit cell structure U1 are repeated on the third source substrate 301R to form a two-dimensional array having the two-dimensional periodicity. Instances of the fourth unit cell structure U1 are repeated on the fourth source substrate 301S to form a two-dimensional array having the two-dimensional periodicity.

Each instance of a unit cell structure (U1, U2, U3, or U4) can include a plurality of devices of the same type, which can be the first devices 10B, the second devices 10G, the third devices 10R, or the fourth devices 10S. The number of the devices in each unit cell structure (U1, U2, U3, U4) can be the same as the number of the backplanes (401, 402, 403, 404), which is four in the illustrative example. Each instance of a unit cell structure (U1, U2, U3, or U4) can include multiple device-side bonding structures (121, 122, 123, 124) of different types, which may include a first device-side bonding structure 121, a second device-side bonding structure 122, a third device-side bonding structure 123, and a fourth device-side bonding structure 124.

In one embodiment, each instance of the first device-side bonding structure 121 can include a first metal that forms a first eutectic with a metal in target-side bonding structures 14 that are provided on the backplanes (401, 402, 403, 404) at a first eutectic temperature. Each instance of the second device-side bonding structure 122 can include a second metal that forms a second eutectic with the metal in target-side bonding structures 14 that are provided on the backplanes (401, 402, 403, 404) at a second eutectic temperature. Each instance of the third device-side bonding structure 123 can include a third metal that forms a third eutectic with the metal in target-side bonding structures 14 that are provided on the backplanes (401, 402, 403, 404) at a third eutectic temperature. Each instance of the fourth device-side bonding structure 124 can include a fourth metal that forms a fourth eutectic with the metal in target-side bonding structures 14 that are provided on the backplanes (401, 402, 403, 404) at a fourth eutectic temperature. The first metal, the second metal, the third metal, and the fourth metal can be different from one another. In one embodiment, the second eutectic temperature can be higher than the first eutectic temperature, the third eutectic temperature can be higher than the second eutectic temperature, and the fourth eutectic temperature can be higher than the third eutectic temperature.

A periodic array of multiple instances of a backplane-side unit cell structure UT can be provided on a surface of each backplane (401, 402, 403, 404). In one embodiment, the array of multiple instances of a backplane-side unit cell structure UT can be a two-dimensional rectangular periodic array in which the multiple instances of the backplane-side unit cell structure UT are repeated in two orthogonal directions that are perpendicular to a surface of a respective backplane (401, 402, 403, 404). In one embodiment, each instance of the backplane-side unit cell structure UT can include a plurality of bonding structures configured to mate with each type of device-side bonding structures (121, 122, 123, 124). In an illustrative example, each instance of the backplane-side unit cell structure UT can include a bonding structure configured to mate with a first device-side bonding structure 121, a second device-side bonding structure 122, a third device-side bonding structure 123, and a fourth device-side bonding structure 124. In one embodiment, the number of bonding structures in each backplane-side unit cell structure UT can be the same as the number of types of the devices (10B, 10G, 10R, 10S) to be transferred to the respective backplane (401, 402, 403, 404). In one embodiment, each backplane-side bonding structure 14 on the backplanes (401, 402, 403, 404) can include a common metal that forms eutectics with each metal of the device-side bonding structures (121, 122, 123, 124), i.e., with each of the first, second, third, and fourth metals.

In one embodiment, each backplane-side bonding structure 14 on the backplanes (401, 402, 403, 404) can be a bond pad structure having a respective planar surface. In one embodiment, each instance of the first device-side bonding structure 121, the second device-side bonding structure 122, the third device-side bonding structure 123, and the fourth device-side bonding structure 124 can be a bond pad structure having a respective planar surface configured to mate with an instance of the backplane-side bonding structure 14.

In one embodiment, the first unit cell structure U1 can include multiple first devices 10B, i.e., at least two first devices 10B such as three, four, five, or six first devices. An instance of the first device-side bonding structure 121 can be provided on one of the multiple first devices 10B in the first unit cell structure U1, and an instance of the second device-side bonding structure 122 can be provided on another of the multiple first devices 10B in the first unit cell structure U1. Additionally, an instance of the third device-side bonding structure 123 can be provided on yet another of the multiple first devices 10B in the first unit cell structure U1. Additionally, an instance of the fourth device-side bonding structure 124 can be provided on still another of the multiple first devices 10B in the first unit cell structure U1.

Additionally, the second unit cell structure U2 can include multiple second devices 10G, i.e., at least two second devices 10G such as three, four, five, or six first devices. An instance of the first device-side bonding structure 121 can be provided on one of the multiple second devices 10G in the second unit cell structure U2, and an instance of the second device-side bonding structure 122 can be provided on another of the multiple second devices 10G in the second unit cell structure U2. Additionally, an instance of the third device-side bonding structure 123 can be provided on yet another of the multiple second devices 10G in the second unit cell structure U2. Additionally, an instance of the fourth device-side bonding structure 124 can be provided on still another of the multiple second devices 10G in the second unit cell structure U2.

Additionally, the third unit cell structure U3 can include multiple third devices 10R, i.e., at least two third devices 10R such as three, four, five, or six first devices. An instance of the first device-side bonding structure 121 can be provided on one of the multiple third devices 10R in the third unit cell structure U3, and an instance of the second device-side bonding structure 122 can be provided on another of the multiple third devices 10R in the third unit cell structure U3. Additionally, an instance of the third device-side bonding structure 123 can be provided on yet another of the multiple third devices 10R in the third unit cell structure U3. Additionally, an instance of the fourth device-side bonding structure 124 can be provided on still another of the multiple third devices 10R in the third unit cell structure U3.

Additionally, the fourth unit cell structure U4 can include multiple fourth devices 10S, i.e., at least two fourth devices 10S such as three, four, five, or six first devices. An instance of the first device-side bonding structure 121 can be provided on one of the multiple fourth devices 10S in the fourth unit cell structure U4, and an instance of the second device-side bonding structure 122 can be provided on another of the multiple fourth devices 10S in the fourth unit cell structure U4. Additionally, an instance of the third device-side bonding structure 123 can be provided on yet another of the multiple fourth devices 10S in the fourth unit cell structure U4. Additionally, an instance of the fourth device-side bonding structure 124 can be provided on still another of the multiple fourth devices 10S in the fourth unit cell structure U4.

Each instance of the first device-side bonding structure 121, the second device-side bonding structure 122, the third device-side bonding structure 123, and the fourth device-side bonding structure 124 can be a bond pad structure having a respective planar surface configured to mate with an instance of the backplane-side bonding structure 14.

Generally, the first source coupon (301B, 10B) can include a first source substrate 301R and a periodic array of multiple instances of a first unit cell structure U1 that comprises at least one first device 10B (such as multiple first devices 10B) and having a same periodicity as the periodic array of multiple instances of the backplane-side unit cell structure UT. An instance of the first device-side bonding structure 121 including the first metal can be provided on one first device 10B per each first unit cell structure U1, and the common metal and the first metal are selected to provide a first bonding metallurgy having the first eutectic temperature upon bonding in a subsequent process.

The second source coupon (301G, 10G) can include a second source substrate 301G and a periodic array of multiple instances of a second unit cell structure U2 that comprises at least one second device 10G and having the same periodicity as the periodic array of multiple instances of the backplane-side unit cell structure UT. An instance of the second device-side bonding structure 122 including the second metal is provided on one second device 10G per each second unit cell structure U2, and the common metal and the second metal are selected to provide a second bonding metallurgy having a second eutectic temperature upon bonding. The second eutectic temperature is greater than the first eutectic temperature.

The third source coupon (301R, 10R) can include a third source substrate 301R and a periodic array of multiple instances of a third unit cell structure U3 that comprises at least one third device 10R and having the same periodicity as the periodic array of multiple instances of the backplane-side unit cell structure UT. An instance of the third device-side bonding structure 123 including the third metal is provided on one third device 10R per each third unit cell structure U3, and the common metal and the third metal are selected to provide a third bonding metallurgy having a third eutectic temperature upon bonding. The third eutectic temperature is greater than the second eutectic temperature.

The fourth source coupon (301S, 10S) can include a fourth source substrate 301S and a periodic array of multiple instances of a fourth unit cell structure U4 that comprises at least one fourth device 10S and having the same periodicity as the periodic array of multiple instances of the backplane-side unit cell structure UT. An instance of the fourth device-side bonding structure 124 including the fourth metal is provided on one fourth device 10S per each fourth unit cell structure U4, and the common metal and the fourth metal are selected to provide a fourth bonding metallurgy having a fourth eutectic temperature upon bonding. The fourth eutectic temperature is greater than the first, second, and third eutectic temperatures.

Referring to FIG. 8B, each source coupon (301B, 301G, 301R, 301S) and a respective backplane (401, 402, 403, 404) are brought into contact with each other such that each device-side bonding structure (121, 122, 123, 124) contacts a mating backplane-side bonding structure 14. In an illustrative example, the first source coupon 301B can contact the first backplane 401 through vertically stacked pairs of a device-side bonding structure (121, 122, 123, 124) and a mating backplane-side bonding structure 14. The second source coupon 301B can contact the second backplane 401 through vertically stacked pairs of a device-side bonding structure (121, 122, 123, 124) and a mating backplane-side bonding structure 14. The third source coupon 301B can contact the third backplane 401 through vertically stacked pairs of a device-side bonding structure (121, 122, 123, 124) and a mating backplane-side bonding structure 14. The fourth source coupon 301B can contact the fourth backplane 401 through vertically stacked pairs of a device-side bonding structure (121, 122, 123, 124) and a mating backplane-side bonding structure 14.

Figure 7B:
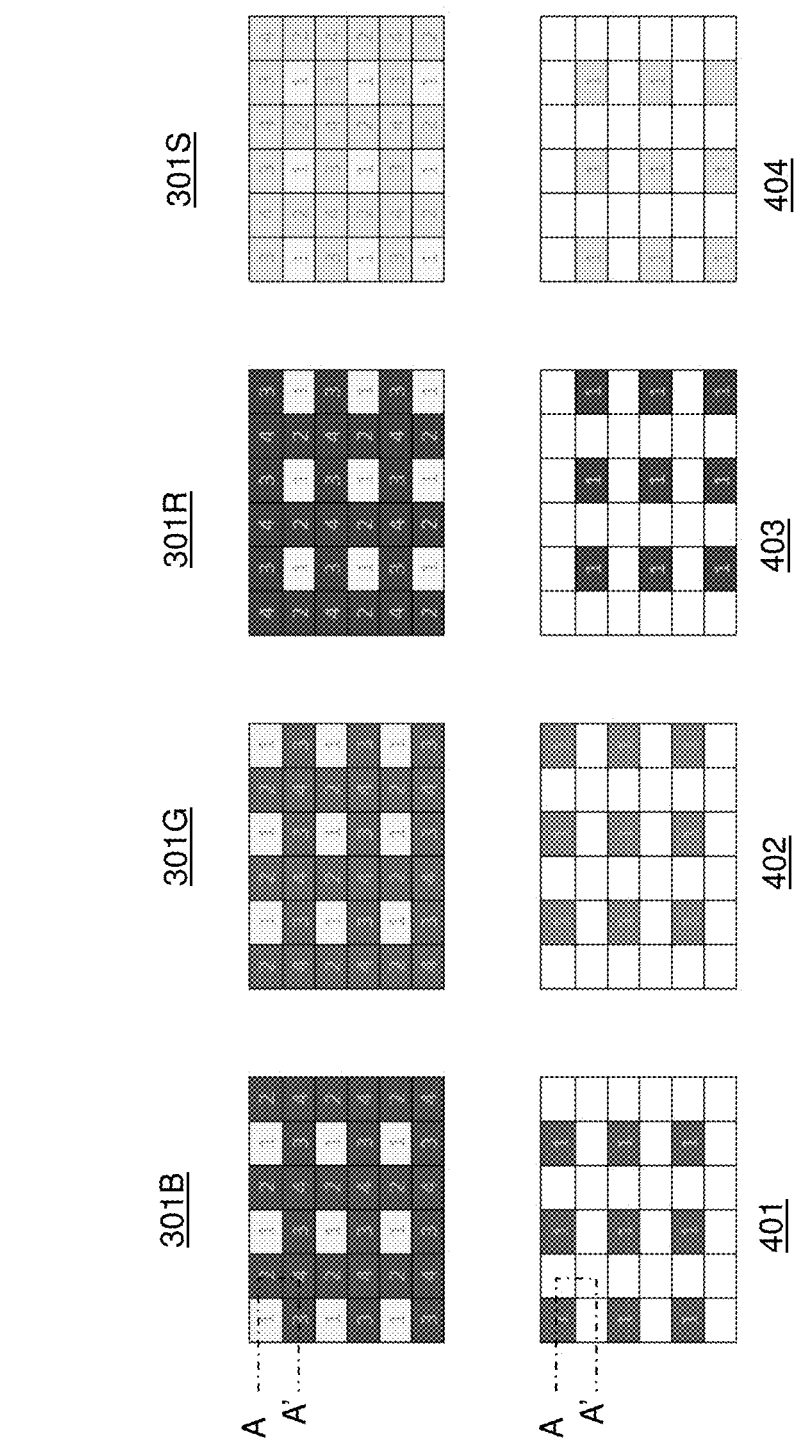

Referring to FIGS. 7B and 8C, the mated pairs of a source coupon (301B, 301G, 301R, 301S) and a respective backplane (401, 402, 403, 404) are annealed at a first anneal temperature, which is at, or greater than, the first eutectic temperature at which the combination of the common metal in the backplane-side bonding structures 14 and the first metal in the first device-side bonding structures 121 form a eutectic compound and reflowed to form first bonded solder material portions 161.

In an illustrative example, devices (10B, 10G, 10R, 10S) that are marked with "1" are provided with a respective first device-side bonding structure 121, and thus, are bonded to the respective backplane (401, 402, 403, 404). Devices (10B, 10G, 10R, 10S) that are marked with "2," "3," or "4" are provided with a respective second, third, or fourth device-side bonding structure (122, 123, 124), and thus, are not bonded to any backplane (401, 402, 403, 404).

In one embodiment, one first device 10B from each instance of the first unit cell structure U1 can be transferred to the first backplane 401 by bonding respective instances of the first device-side bonding structure 121 to matching backplane-side bonding structures 14. A periodic array of first bonded solder material portions 161 having the first bonding metallurgy is formed while backplane-side bonding structures 14 that are not bonded do not reflow. First devices 10B provided with respective instances of the second, third, or fourth device-side bonding structure (122, 123, or 124) are not transferred to the first backplane 401 during transfer of the first devices 10B provided with respective instances of the first device-side bonding structure 121. Instances of the second, third, and fourth device-side bonding structures on the first devices 10B on the first source substrate 301B are in physical contact with respective backplane-side bonding structure 14 without reflowing during transfer of the first devices 10B provided with respective instances of the first device-side bonding structure 121 to the first backplane 401.

Similarly, the second devices 10G provided with the first device-side bonding structures 121 can be bonded to the second backplane 402, while the second devices 10G provided with the second, third, or fourth device-side bonding structures (122, 123, 124) are not bonded to the second backplane 402. The third devices 10R provided with the first device-side bonding structures 121 can be bonded to the third backplane 403, while the third devices 10R provided with the second, third, or fourth device-side bonding structures (122, 123, 124) are not bonded to the third backplane 403. The fourth devices 10S provided with the first device-side bonding structures 121 can be bonded to the fourth backplane 404, while the fourth devices 10S provided with the second, third, or fourth device-side bonding structures (122, 123, 124) are not bonded to the fourth backplane 404.

Referring to FIG. 8D, an alternative method can be employed to bond the devices with an instance of the first device-side bonding structure 121 to respective backplanes (401, 402, 403, 404). Specifically, the devices (10B, 10G, 10R, 10S) with a respective first bonded material portion 12 thereupon can be bonded to a respective second bonded material portion 14 by sequentially reflowing respective at least one solder material portion (within the vertical stacks of a first device-side bonding structure 121 and a backplane-side bonding structure 14. In one embodiment, the reflowing of the solder material portions can be performed by irradiating a laser beam on each solder material pads to be reflowed. The laser beam can be provided by a laser 377. The wavelength of the laser beam can be selected such that the laser beam passes through the respective source substrate (301B, 301G, 301R, 301S) and the respective devices (10B, 10G, 10R, 10S). In one embodiment, the wavelength of the laser beam can be in a visible light range (i.e., a wavelength range from 400 nm to 800 nm) or in the infrared range (i.e., wavelength range from 800 nm to 1 mm).

A first bonded solder material portion 161 is formed by reflow of each solder material underlying the bonded devices (10B, 10G, 10R, 10S). Each first bonded solder material portion 161 includes a reflowed and re-solidified solder material and additionally includes a pair of metal pads (not separately shown) that are attached to the respective backplane (401, 402, 403, 404) and a respective device (10B, 10G, 10R, 10S).

Figure 8E:
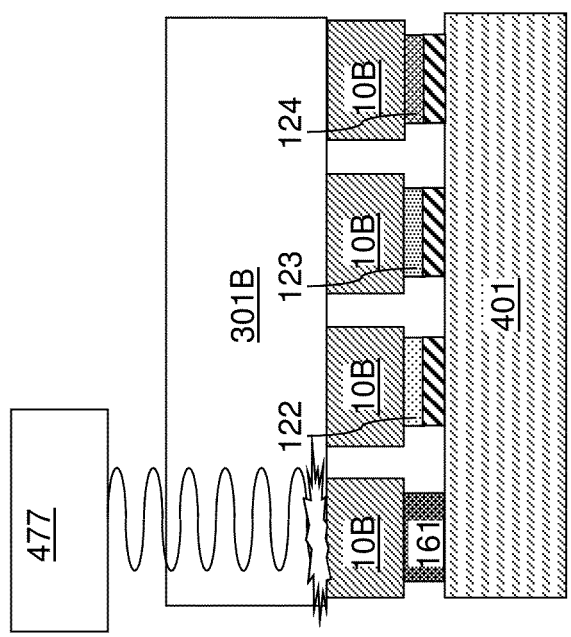
Figure 8H:
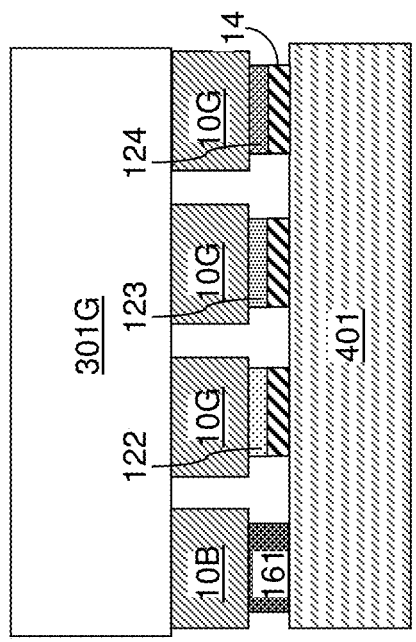
Figure 8G:
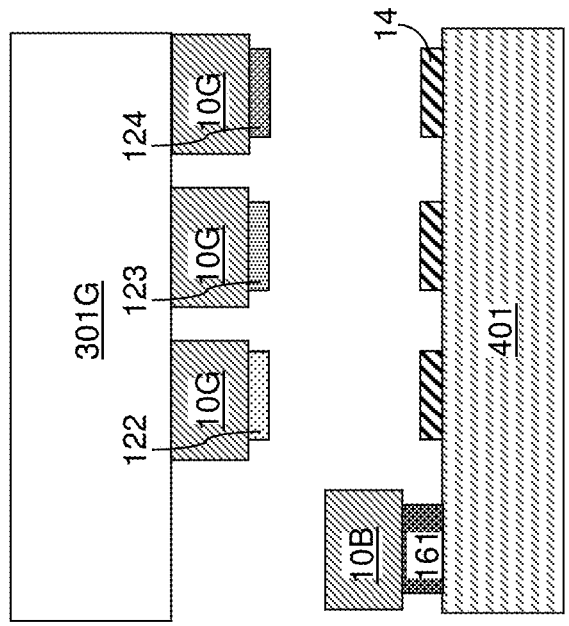

Referring to FIG. 8E, each bonded device (10B, 10G, 10R, 10S) can be detached from a respective source substrate (301B, 301G, 301R, 301S). In one embodiment, each source substrate (301B, 301G, 301R, 301S) can comprises a bulk material portion (e.g., a transfer substrate 300) that is transparent to the laser beam and adjoined to at least one surface portion (such as the release layer 20 and the bonding material layer 30) of the source substrate (301B, 301G, 301R, 301S). The laser beam can be provided by a laser 477. In one embodiment, the laser beam can pass through the bulk material portion prior to impinging on the at least one surface portion of the source substrate (301B, 301G, 301R, 301S).

In one embodiment, the laser beam can ablate each surface portion of the source substrate (301B, 301G, 301R, 301S) that is proximal to the bonded devices (10B, 10G, 10R, 10S). In one embodiment, surface portions of the source substrate (301B, 301G, 301R, 301S) that are proximal to the bonded devices (10B, 10G, 10R, 10S) can comprise a release layer 20. In one embodiment, the release layer can include silicon nitride or a semiconductor material (such as GaN) that is ablated upon absorption of the laser beam. In this case, the laser wavelength can be an ultraviolet wavelength (such as 248 nm or 193 nm), and irradiating the surface portions of the source substrate 301 with the laser beam can ablate the surface portions.

Referring to FIG. 8F, the source substrates (301B, 301G, 301R, 301S) and the devices (10B, 10G, 10R, 10S) that are not bonded to the backplanes (401, 402, 403, 404) are separated from each combination of a backplane (401, 402, 403, 404) and bonded devices (10B, 10G, 10R, 10S) thereupon.

Figure 7C:
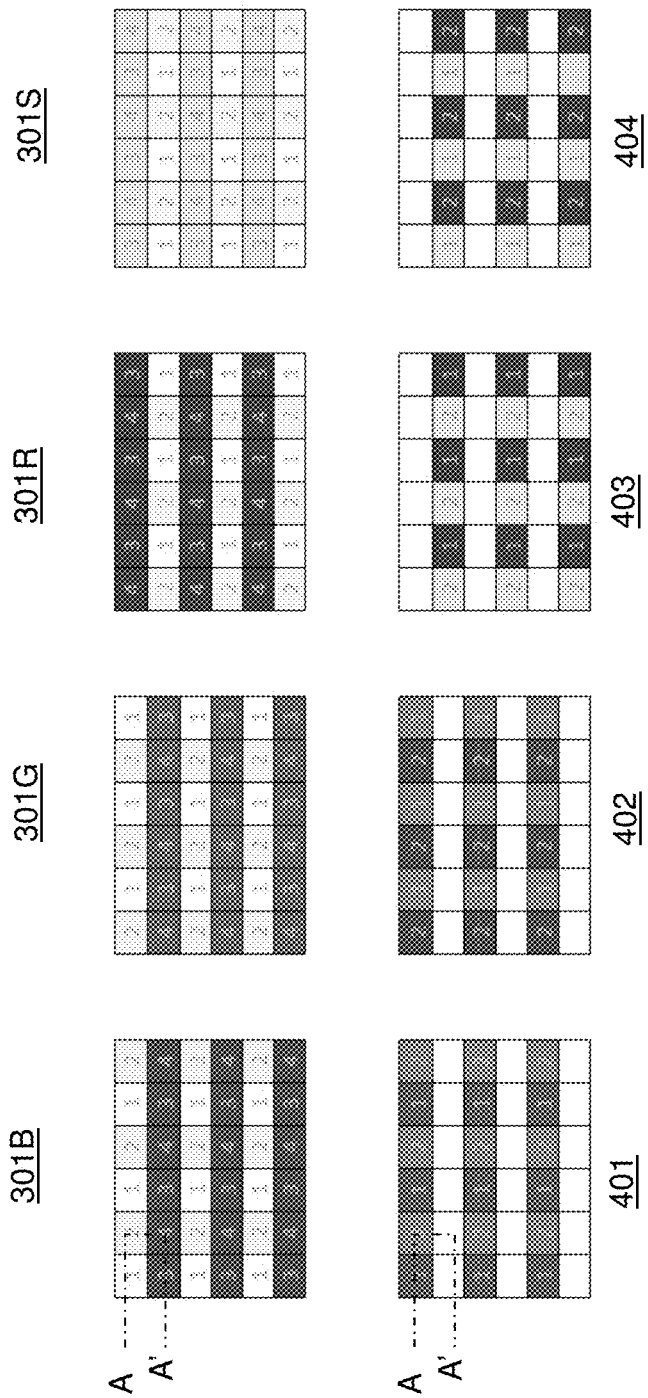

Referring to FIG. 7C, the source coupons and the backplanes are matched so that the next sets of devices to be transferred are matched to the target bonding sites. The processing steps of FIGS. 8G, 8H, 8I, 8K, and 8L or the processing steps of FIGS. 8G, 8H, 8J, 8K, and 8L are sequentially formed to transfer the next sets of devices to the respective backplanes (401, 402, 403, 404). Processing step in FIGS. 8G-8L may employ the same methods as the processing steps of FIGS. 8A-8F mutatis mutandis. The devices labeled "2" are transferred to the respective backplanes (401, 402, 403, 404) through the processing steps of FIGS. 8G-8L. The sequence of processing steps may be performed for the pair of first source coupon (301B, 10B) and the second backplane 402, for the pair of the second source coupon (301G, 10G) and the first backplane 401, for the pair of the third source coupon (301R, 10R) and the fourth backplane 404, and for the pair of the fourth source coupon (301S, 10S) and the third backplane 403. It is understood that the source coupons and/or the backplanes may be aligned to avoid collision between previously bonded devices and devices in a newly disposed source coupon.

Figure 8J:
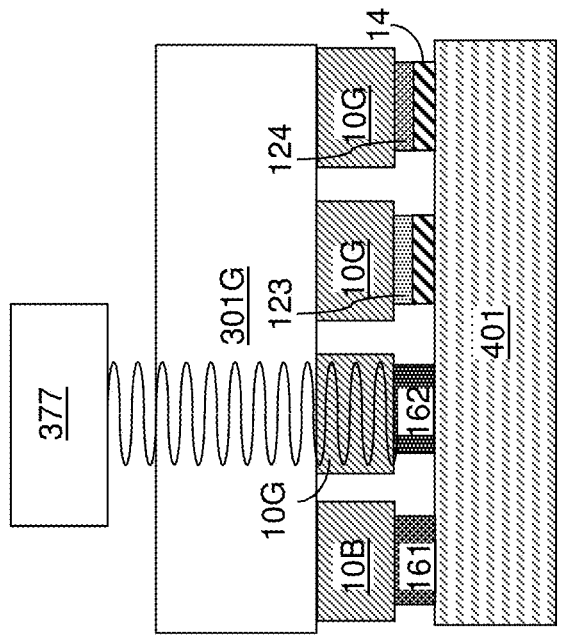
FIG. 8J is a vertical cross-sectional view of an alternative structure for the structure of FIG. 8I according to an embodiment of the present disclosure.
Figure 8I:
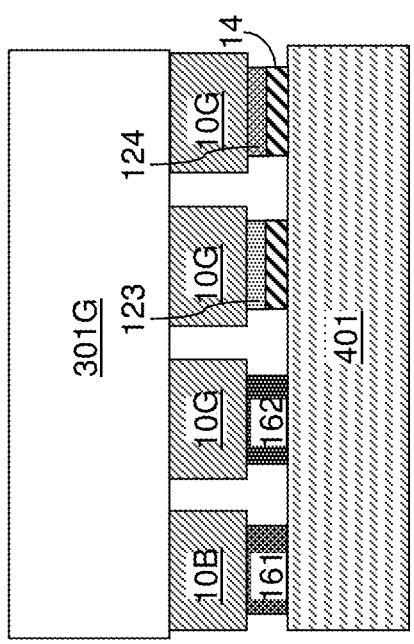
Figure 8L:
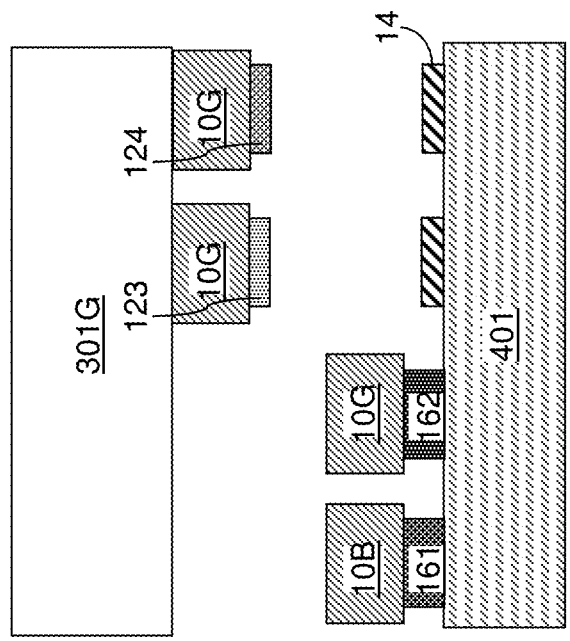
Figure 8K:
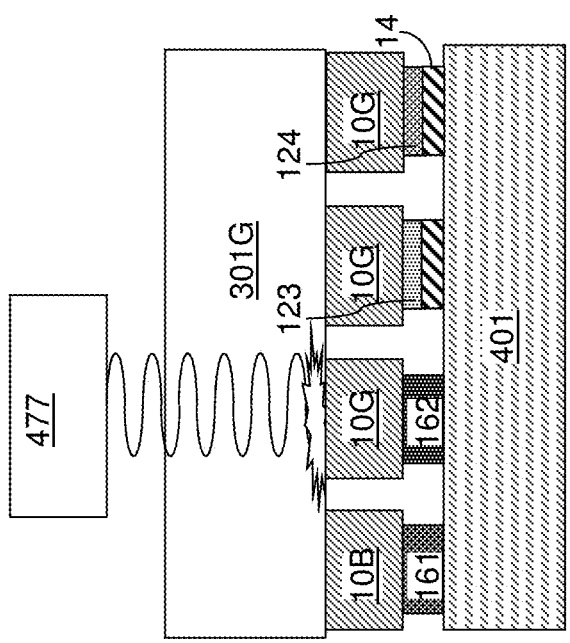
Figure 8N:
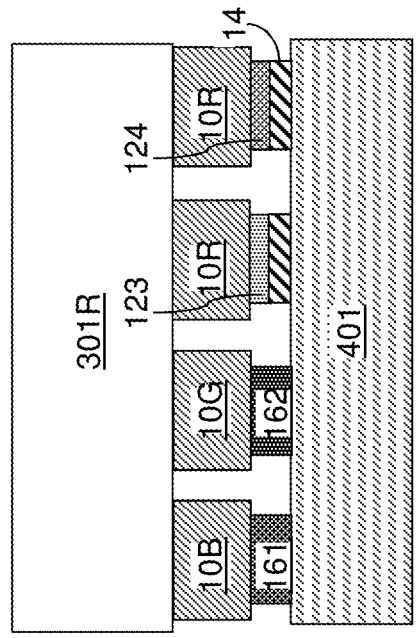
Figure 8M:
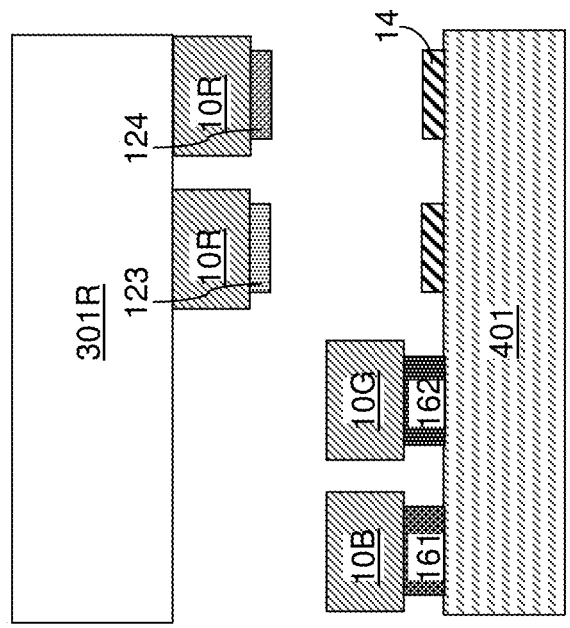
Figure 8P:
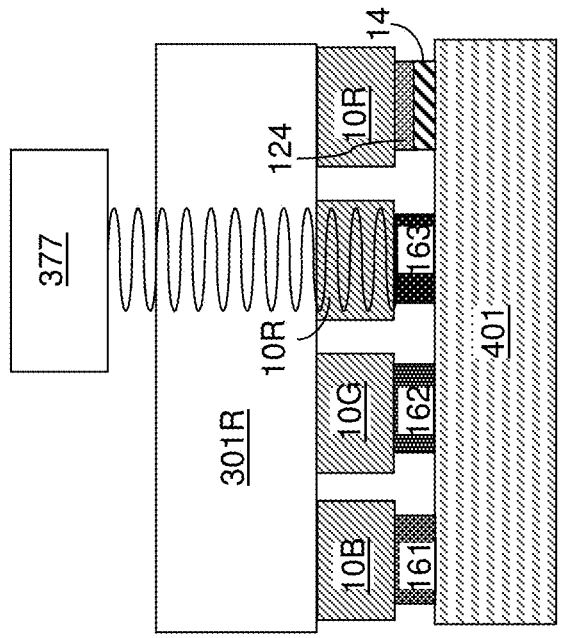
FIG. 8P is a vertical cross-sectional view of an alternative structure for the structure of FIG. 8O according to an embodiment of the present disclosure.
Figure 8O:
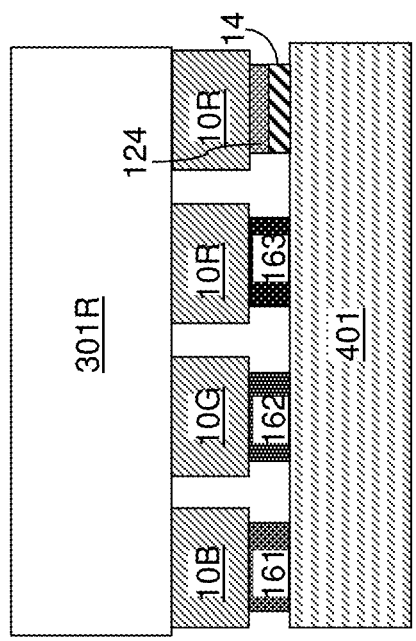
Figure 8Q:
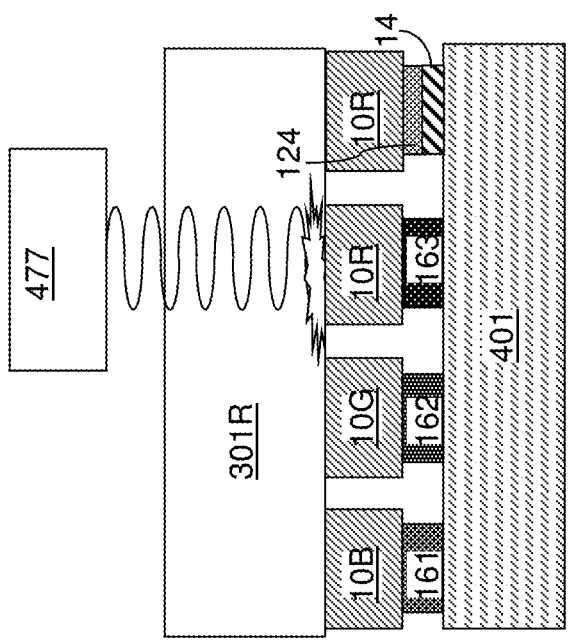
Figure 8R:
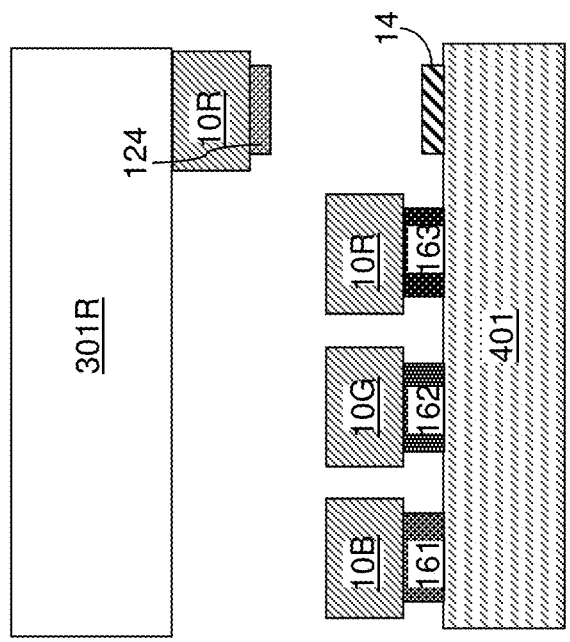
Figure 8T:
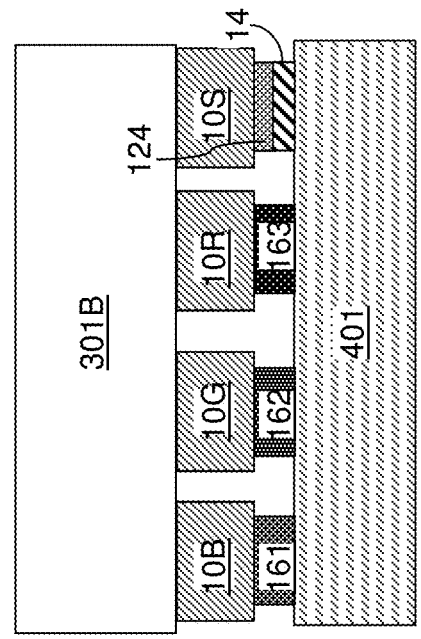
Figure 8S:
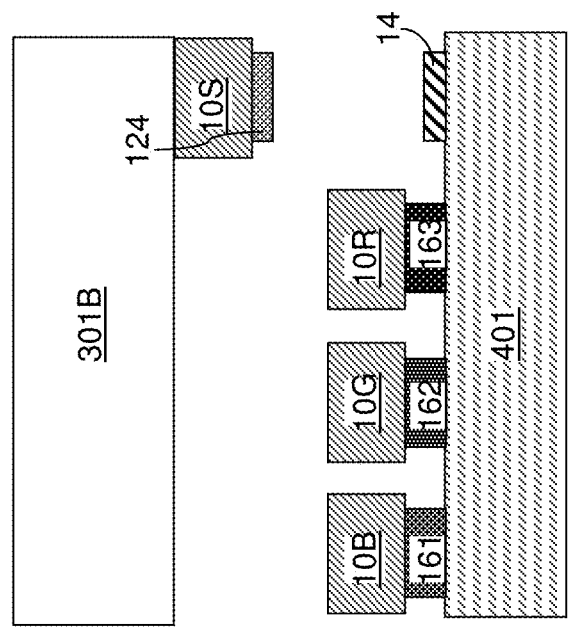
Figure 8V:
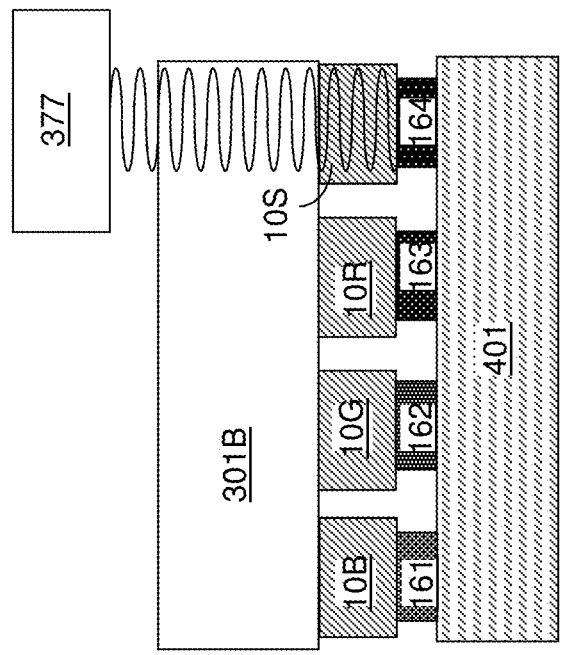
FIG. 8V is a vertical cross-sectional view of an alternative structure for the structure of FIG. 8U according to an embodiment of the present disclosure.
Figure 8U:
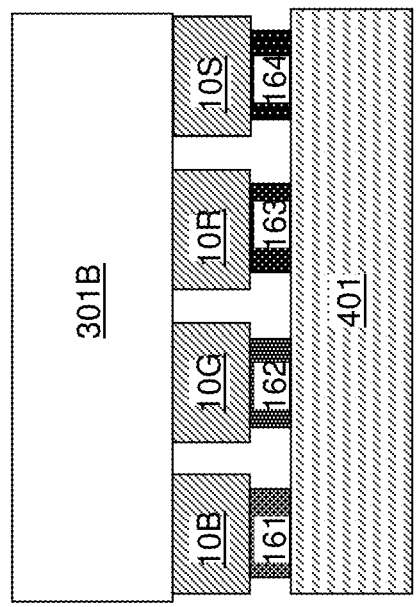
Figures 8W, 8X:
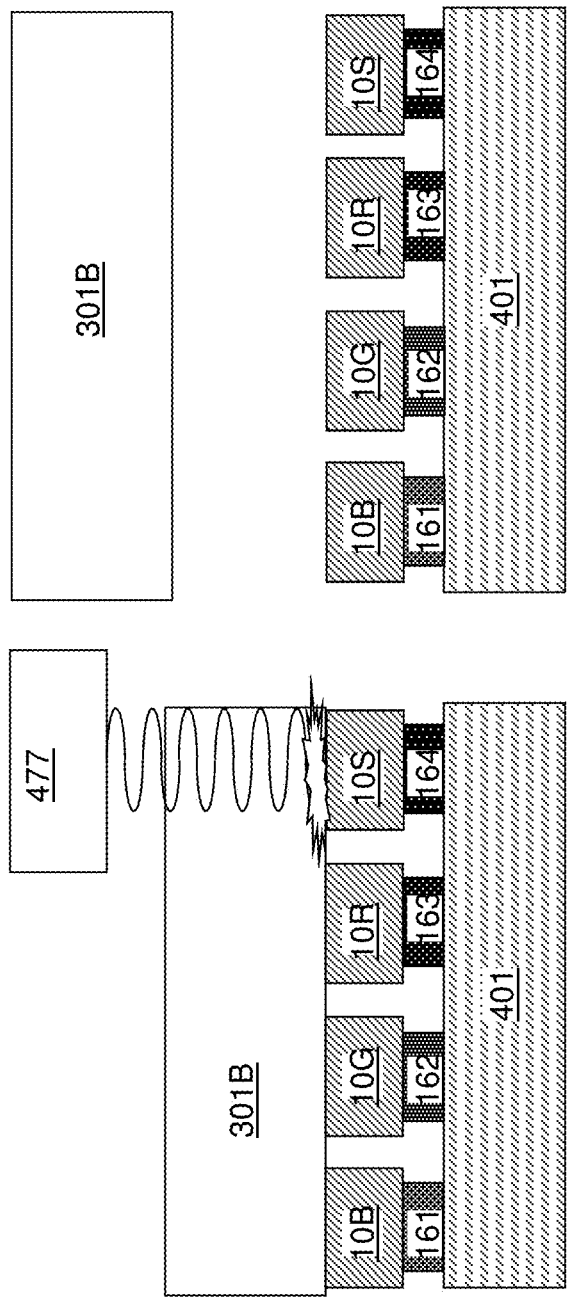

The bonding processes of FIG. 8I or 8J are modified to induce bonding of each vertically contacting pair of a second device-side bonding structure 122 and a backplane-side bonding structure 14. In one embodiment, one second device 10G from each instance of the second unit cell structure U2 can be transferred to the first backplane 401 by bonding respective instances of the second device-side bonding structure 122 to matching backplane-side bonding structures 14. A periodic array of second bonded material portions 162 having the second bonding metallurgy is formed while backplane-side bonding structures 14 that are not bonded do not reflow. Second devices 10G provided with respective instances of the third or fourth device-side bonding structure (123, or 124) are not transferred to the first backplane 401 during transfer of the second devices 10G provided with respective instances of the second device-side bonding structure 122. Instances of the third and fourth device-side bonding structures (123, 124) on the second devices 10G on the first source substrate 301B are in physical contact with respective backplane-side bonding structure 14 without reflowing during transfer of the second devices 10B provided with respective instances of the second device-side bonding structure 122 to the first backplane 401.

Figure 7D:
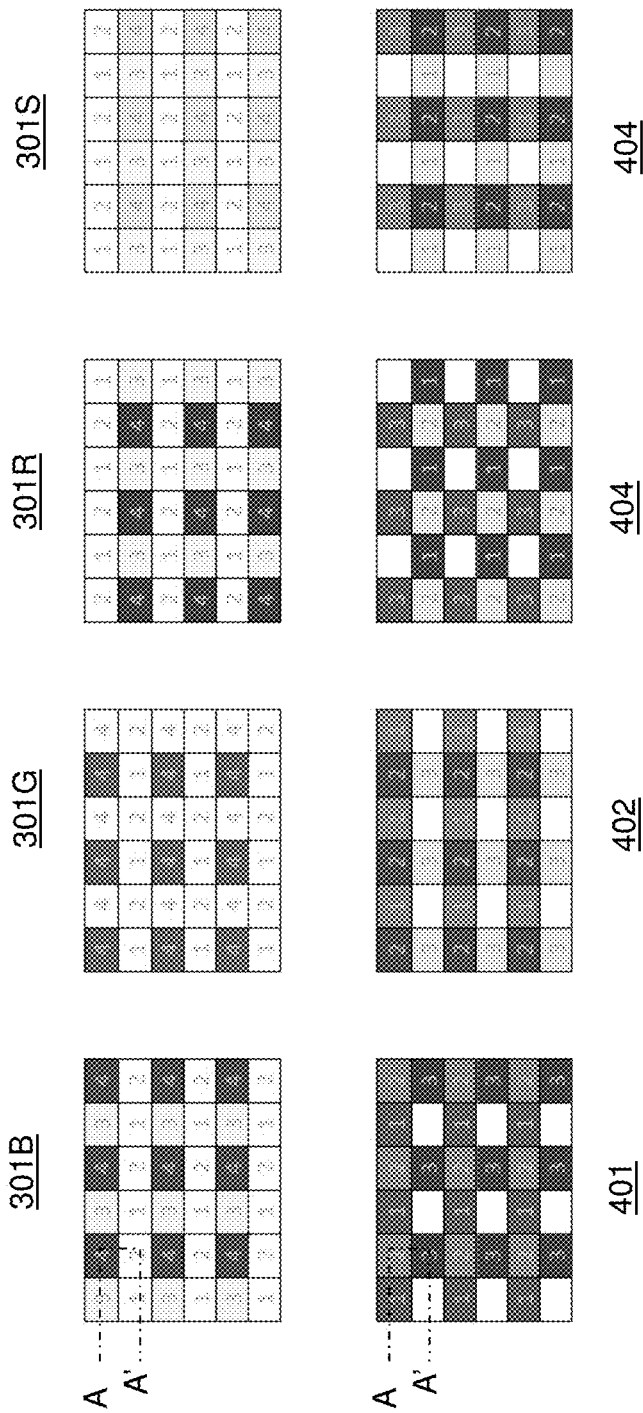

Referring to FIG. 7D, the source coupons and the backplanes are matched so that the next sets of devices to be transferred are matched to the target bonding sites. The processing steps of FIGS. 8M, 8N, 8O, 8Q, and 8R or the processing steps of 8M, 8N, 8P, 8Q, and 8R are sequentially formed to transfer the next sets of devices to the respective backplanes (401, 402, 403, 404). Processing step in FIGS. 8M-8R may employ the same methods as the processing steps of FIGS. 8A-8F mutatis mutandis. The devices labeled "3" are transferred to the respective backplanes (401, 402, 403, 404) through the processing steps of FIGS. 8M-8R. The sequence of processing steps may be performed for the pair of first source coupon (301B, 10B) and the third backplane 403, for the pair of the second source coupon (301G, 10G) and the fourth backplane 404, for the pair of the third source coupon (301R, 10R) and the first backplane 401, and for the pair of the fourth source coupon (301S, 10S) and the second backplane 402. It is understood that the source coupons and/or the backplanes may be aligned to avoid collision between previously bonded devices and devices in a newly disposed source coupon.

The bonding processes of FIG. 8I or 8J are modified to induce bonding of each vertically contacting pair of a third device-side bonding structure 123 and a backplane-side bonding structure 14. In one embodiment, one third device 10R from each instance of the third unit cell structure U3 can be transferred to the first backplane 401 by bonding respective instances of the third device-side bonding structure 123 to matching backplane-side bonding structures 14. A periodic array of third bonded material portions 163 having the third bonding metallurgy is formed while backplane-side bonding structures 14 that are not bonded do not reflow. Third devices 10R provided with respective instances of the fourth device-side bonding structure 124 are not transferred to the first backplane 401 during transfer of the third devices 10R provided with respective instances of the third device-side bonding structure 123. Instances of the fourth device-side bonding structures 124 on the third devices 10R on the first source substrate 301B are in physical contact with respective backplane-side bonding structure 14 without reflowing during transfer of the third devices 10B provided with respective instances of the third device-side bonding structure 123 to the first backplane 401.

Figure 7E:
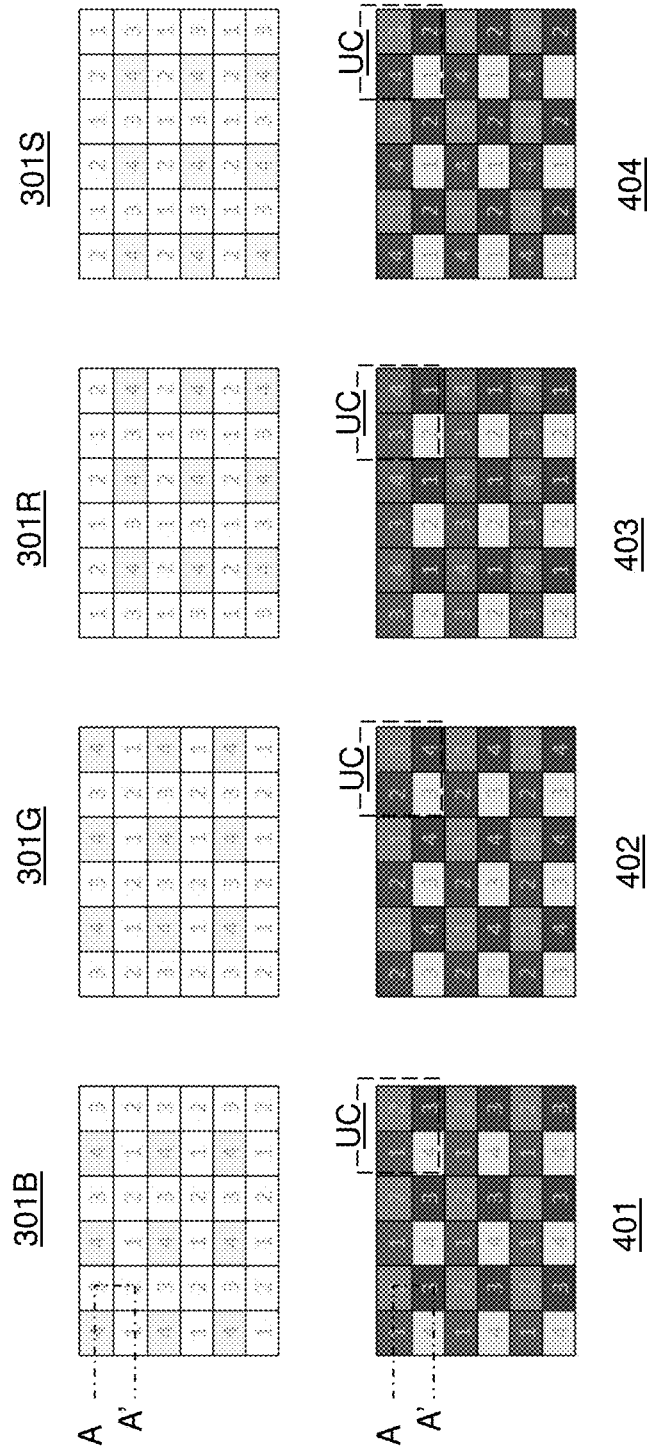

Referring to FIG. 7E, the source coupons and the backplanes are matched so that the next sets of devices to be transferred are matched to the target bonding sites. The processing steps of FIGS. 8S, 8T, 8U, 8W, and 8X or the processing steps of 8S, 8T, 8V, 8W, and 8X are sequentially formed to transfer the next sets of devices to the respective backplanes (401, 402, 403, 404). Processing step in FIGS. 8S-8X may employ the same methods as the processing steps of FIGS. 8A-8F mutatis mutandis. The devices labeled "4" are transferred to the respective backplanes (401, 402, 403, 404) through the processing steps of FIGS. 8S-8X. The sequence of processing steps may be performed for the pair of first source coupon (301B, 10B) and the fourth backplane 404, for the pair of the second source coupon (301G, 10G) and the third backplane 403, for the pair of the third source coupon (301R, 10R) and the second backplane 402, and for the pair of the fourth source coupon (301S, 10S) and the first backplane 401. It is understood that the source coupons and/or the backplanes may be aligned to avoid collision between previously bonded devices and devices in a newly disposed source coupon.

The bonding processes of FIG. 8I or 8J are modified to induce bonding of each vertically contacting pair of a fourth device-side bonding structure 124 and a backplane-side bonding structure 14. In one embodiment, one fourth device 10S from each instance of the fourth unit cell structure U4 can be transferred to the first backplane 401 by bonding respective instances of the fourth device-side bonding structure 124 to matching backplane-side bonding structures 14. A periodic array of fourth bonded material portions 164 having the fourth bonding metallurgy is formed.

The device assemblies including any of the backplanes (401, 402, 403, 404) as illustrated in FIGS. 7E and 8X can include a periodic array of multiple instances of a unit cell structure. Each instance of the unit cell structure UC comprises a first device 10B bonded to the backplane (401, 402, 403, or 402) through a first bonded material portion 161 employing a first bonding metallurgy, a second device 10G bonded to the backplane (401, 402, 403, or 402) through a second bonded material portion 162 employing a second bonding metallurgy, a third device 10R bonded to the backplane (401, 402, 403, or 402) through a third bonded material portion 163 employing a third bonding metallurgy, and a fourth device 10S bonded to the backplane (401, 402, 403, or 402) through a fourth bonded material portion 164 employing a fourth bonding metallurgy.

In one embodiment, the first bonding metallurgy, the second bonding metallurgy, the third bonding metallurgy, and the fourth bonding metallurgy can include a common metal. The first bonding metallurgy can include a first metal that is not present in the second, third, and fourth bonding metallurgies. The second bonding metallurgy can include a second metal that is not present in the first, third, and fourth bonding metallurgies. The third bonding metallurgy can include a third metal that is not present in the first, second, and fourth bonding metallurgies. The fourth bonding metallurgy can include a fourth metal that is not present in the first, second, and third bonding metallurgies.

In an illustrative example, the first device 10B may be a first light emitting device that emits light with a peak intensity at a first wavelength, the second device 10G may be a second light emitting device that emits light with a peak intensity at a second wavelength that is different from the first wavelength, the third device 10R may be a third light emitting device that emits light with a peak intensity at a third wavelength that is different from the first and second wavelengths, and the fourth device 10S may be a sensor semiconductor device, i.e., a semiconductor device that provides the electrical function of sensing a local physical parameter such as a touch in a touch screen. In one embodiment, the device assembly can be an integrated light emitting device assembly.

In one embodiment, the top surfaces of all instances of the first, second, third, and fourth devices (10B, 10G, 10R, 10S) on each backplane (401, 402, 403, 404) may be within a same horizontal plane, for example, by reflowing of the solder material portions (161, 162, 163, 164) at a temperature at, or greater than, the fourth eutectic temperature while pushing the first, second, third, and fourth devices (10B, 10G, 10R, 10S) toward the respective backplane (401, 402,403, 404) with a support substrate having a planar surface.

The periodic array of devices (10B, 10G, 10R, 10S) as attached to a backplane (401, 402, 403, 404) can be the same as the periodicity of the backplane-side unit cell structure UT, which is the same as the periodicity of the first, second, third, and fourth unit structures (U1, U2, U3, U4). In one embodiment, the periodic array can be a two-dimensional rectangular periodic array in which the multiple instances of the unit cell structure are repeated in two orthogonal directions that are perpendicular to a surface of the backplane to which the periodic array is attached.

In one embodiment, the device assembly can be an integrated light emitting device assembly that comprises an emissive display panel containing light emitting diodes that emit three or more different colors. In one embodiment, the emissive display panel can comprise a direct view display panel containing red, green, and blue wavelength light emitting diodes and sensors bonded to the backplane.

The common metal for the backplane-side bonding structures can be selected from any metal that provides multiple eutectics with multiple metals. Non-limiting exemplary combination of a common metal and multiple metals that provide multiple eutectic systems are listed in Table 1.

TABLE 1

Examples of metals that provide multiple
eutectic systems with other metals.

| Tin Based | In Based |
| --- | --- |

TABLE 1-continued

| T$_m$(Sn) = 232C | | | T$_m$(In) =156C | | |
|---|---|---|---|---|---|
| Binary | Lowest | Highest | Binary | Lowest | Highest |
| Au—Pd | 100 | | Au—Pd | 100 | |
| In—Sn | 120 | | In—Sn | 120 | |
| Ag—In | 144 | 205 | Ag—In | 144 | 205 |
| Au—In | 153 | 224 | Au—In | 153 | 224 |
| Cu—In | 153 | 310 | Cu—In | 153 | 310 |
| In—Pt | 154 | | In—Pt | 154 | |
| In—Pd | 156 | | In—Pd | 156 | |
| In—Te | 156 | 418 | In—Te | 156 | 418 |
| Cu—Sn | 186 | 227 | Cu—Sn | 186 | 227 |
| Sn—Zn | 199 | | Sn—Zn | 199 | |
| Au—Sn | 217 | 252 | Au—Sn | 217 | 252 |
| Ag—Sn | 221 | | Ag—Sn | 221 | |
| Al—Sn | 228 | | Al—Sn | 228 | |
| Sn—Te | 228 | | Sn—Te | 228 | |
| Pd—Sn | 230 | | Pd—Sn | 230 | |
| Ge—Sn | 231 | | Ge—Sn | 231 | |
| Ni—Sn | 231 | | Ni—Sn | 231 | |
| Sn—Ti | 231 | | Sn—Ti | 231 | |
| Cr—Sn | 232 | | Cr—Sn | 232 | |
| Nb—Sn | 232 | | Nb—Sn | 232 | |
| Sn—Sn | 232 | | Sn—Sn | 232 | |
| Au—Cu | 240 | | Au—Cu | 240 | |
| Cu—Ni | 250 | 350 | Cu—Ni | 250 | 350 |
| Ag—Te | 295 | 353 | Ag—Te | 295 | 353 |
| Cu—Te | 340 | | Cu—Te | 340 | |
| Al—Cr | 350 | | Al—Cr | 350 | |
| Au—Ge | 360 | | Au—Ge | 360 | |
| Au—Si | 363 | | Au—Si | 363 | |
| Ge—Te | 365 | 400 | Ge—Te | 365 | 400 |
| Cu—Pd | 400 | | Cu—Pd | 400 | |
| Cu—Pt | 418 | | Cu—Pt | 418 | |

| Te Based T$_m$(Te) = 449C | | | Cu Based Eutectics & Solid State Rx | | |
|---|---|---|---|---|---|
| Binary | Lowest | Highest | Binary | Lowest | Highest |
| Au—Pd | 100 | | Au—Pd | 100 | |
| In—-Sn | 120 | | In—Sn | 120 | |
| Ag—In | 144 | 205 | Ag—In | 144 | 205 |
| Au—In | 153 | 224 | Au—In | 153 | 224 |
| Cu—In | 153 | 310 | Cu—In | 153 | 310 |
| In—Pt | 154 | | In—Pt | 154 | |
| In—Pd | 156 | | In—Pd | 156 | |
| In—Te | 155 | 418 | In—Te | 156 | 418 |
| Cu—Sn | 186 | 227 | Cu—Sn | 186 | 227 |
| Sn—Zn | 199 | | Sn—Zn | 199 | |
| Au—Sn | 217 | 252 | Au—Sn | 217 | 252 |
| Ag—Sn | 221 | | Ag—Sn | 221 | |
| Al—Sn | 228 | | Al—Sn | 228 | |
| Sn—Te | 228 | | Sn—Te | 228 | |
| Pd—Sn | 230 | | Pd—Sn | 230 | |
| Ge—Sn | 231 | | Ge—Sn | 231 | |
| Ni—Sn | 231 | | Ni—Sn | 231 | |
| Sn—Ti | 231 | | Sn—Ti | 231 | |
| Cr—Sn | 232 | | Cr—Sn | 232 | |
| Nb—Sn | 232 | | Nb—Sn | 232 | |
| Sn—Sn | 232 | | Sn—Sn | 232 | |
| Au—Cu | 240 | | Au—Cu | 240 | |
| Cu—Ni | 250 | 350 | Cu—Ni | 250 | 350 |
| Ag—Te | 295 | 353 | Ag—Te | 295 | 353 |
| Cu—Te | 340 | | Cu—Te | 340 | |
| Al—Cr | 350 | | Al—Cr | 350 | |
| Au—Ge | 360 | | Au—Ge | 360 | |
| Au—Si | 363 | | Au—Si | 363 | |
| Ge—Te | 365 | 400 | Ge—Te | 365 | 400 |
| Cu—Pd | 400 | | Cu—Pd | 400 | |
| Cu—Pt | 418 | | Cu—Pt | 418 | |

Although the foregoing refers to particular preferred embodiments, it will be understood that the invention is not so limited. It will occur to those of ordinary skill in the art that various modifications may be made to the disclosed embodiments and that such modifications are intended to be within the scope of the invention. Where an embodiment employing a particular structure and/or configuration is illustrated in the present disclosure, it is understood that the present invention may be practiced with any other compatible structures and/or configurations that are functionally equivalent provided that such substitutions are not explicitly forbidden or otherwise known to be impossible to one of ordinary skill in the art.

What is claimed is:

1. A method of forming a device assembly, comprising:
providing a backplane including a periodic array of multiple instances of a backplane-side unit cell structure that comprises a set of backplane-side bonding structures including a common metal;
providing a first source coupon including a first transfer substrate and a periodic array of multiple instances of a first unit cell structure that comprises at least one first device and having a same periodicity as the periodic array of multiple instances of the backplane-side unit cell structure, wherein an instance of a first device-side bonding structure including a first metal is provided on one first device per each first unit cell structure, and the common metal and the first metal are selected to provide a first bonding metallurgy having a first eutectic temperature upon bonding;
transferring one first device from each instance of the first unit cell structure to the backplane by bonding respective instances of the first device-side bonding structure to matching backplane-side bonding structures, wherein a periodic array of first bonded material portions having the first bonding metallurgy is formed while backplane-side bonding structures that are not bonded do not reflow;
providing a second source coupon including a second transfer substrate and a periodic array of multiple instances of a second unit cell structure that comprises at least one second device and having a same periodicity as the periodic array of multiple instances of the backplane-side unit cell structure, wherein an instance of a second device-side bonding structure including a second metal is provided on one second device per each second unit cell structure, and the common metal and the second metal are selected to provide a second bonding metallurgy having a second eutectic temperature upon bonding, and the second eutectic temperature is greater than the first eutectic temperature; and
transferring one second device from each instance of the second unit cell structure to the backplane by bonding respective instances of the second device-side bonding structure to matching backplane-side bonding structures.

2. The method of claim 1, wherein:
a periodic array of second bonded material portions having the second bonding metallurgy is formed by transfer of the second devices; and
the periodic array of first bonded material portions changes composition by partial evaporation of the first metal during transfer of the second devices.

3. The method of claim 1, wherein:
the first unit cell structure comprises at least two first devices;
an instance of the first device-side bonding structure is provided on one of the at least two first devices;
an instance of the second device-side bonding structure is provided on another of the at least two first devices; and
first devices provided with respective instances of the second device-side bonding structure are not transferred to the backplane during transfer of the first devices provided with respective instances of the first device-side bonding structure.

4. The method of claim 3, wherein instances of the second device-side bonding structure on the first devices on the first transfer substrate are in physical contact with respective backplane-side bonding structures without reflowing during transfer of the first devices provided with respective instances of the first device-side bonding structure to the backplane.

5. The method of claim 3, wherein:
the second unit cell structure comprises at least two second devices;
an instance of the second device-side bonding structure is provided on one of the at least two second devices;
an instance of a third device-side bonding structure comprising a third metal is provided on another of the at least two devices, wherein the common metal and the third metal are selected to provide a third bonding metallurgy having a third eutectic temperature upon bonding, and the third eutectic temperature is greater than the first and second eutectic temperatures; and
second devices provided with respective instances of the third device-side bonding structure are not transferred to the backplane during transfer of the second devices provided with respective instances of the second device-side bonding structure.

6. The method of claim 5, wherein the first, second, and third devices comprise red light-emitting diodes, green light-emitting diodes, and blue light-emitting diodes.

7. The method of claim 5, further comprising:
providing a third source coupon including a third transfer substrate and a periodic array of multiple instances of a third unit cell structure that comprises at least one third device and having a same periodicity as the periodic array of multiple instances of the backplane-side unit cell structure, wherein an instance of the third device-side bonding structure is provided on one third device per each third unit cell structure; and
transferring one third device from each instance of the third unit cell structure to the backplane by bonding respective instances of the third device-side bonding structure to matching backplane-side bonding structures.

8. The method of claim 7, wherein:
a periodic array of third bonded material portions having the third bonding metallurgy is formed by transfer of the third devices;
the periodic array of first bonded material portions changes composition by partial evaporation of the first metal during transfer of the third devices; and
the periodic array of second bonded material portions changes composition by partial evaporation of the second metal during transfer of the third devices.

9. The method of claim 7, wherein each of the periodic array of first bonded material portions, the periodic array of second bonded material portions, and the periodic array of third bonded material portions has a same periodicity as the periodic array of multiple instances of the backplane-side unit cell structure.

10. The method of claim 9, wherein the periodic array of multiple instances of the backplane-side unit cell structure is a two-dimensional rectangular periodic array in which the multiple instances of the backplane-side unit cell structure are repeated in two orthogonal directions that are perpendicular to a surface of the backplane.

11. The method of claim 7, wherein the device assembly is an integrated light emitting device assembly that comprises an emissive display panel containing light emitting diodes that emit three or more different colors.

12. The method of claim 11, wherein the emissive display panel comprises a direct view display panel containing red, green, and blue wavelength light emitting diodes and sensors bonded to the backplane.

13. The method of claim 7, further comprising:
providing a fourth source coupon including a fourth transfer substrate and a periodic array of multiple instances of a fourth unit cell structure that comprises at least one fourth device and having a same periodicity as the periodic array of multiple instances of the backplane-side unit cell structure, wherein an instance of the fourth device-side bonding structure is provided on one fourth device per each fourth unit cell structure, and the common metal and the fourth metal are selected to provide a fourth bonding metallurgy having a fourth eutectic temperature upon bonding, and the fourth eutectic temperature is greater than the first, second, and third eutectic temperatures; and
transferring one fourth device from each instance of the fourth unit cell structure to the backplane by bonding respective instances of the fourth device-side bonding structure to matching backplane-side bonding structures, wherein a periodic array of fourth bonded material portions having the fourth bonding metallurgy is formed while the periodic array of first bonded material portions, the periodic array of second bonded material portions, and the periodic array of fourth bonded material portions do not reflow.

\* \* \* \* \*